United States Patent
Keller et al.

(10) Patent No.: US 9,076,927 B2
(45) Date of Patent: Jul. 7, 2015

(54) (IN,GA,AL)N OPTOELECTRONIC DEVICES GROWN ON RELAXED (IN,GA,AL)N-ON-GAN BASE LAYERS

(71) Applicant: The Regents of the University of California, Oakland, CA (US)

(72) Inventors: Stacia Keller, Goleta, CA (US); Carl J. Neufeld, Goleta, CA (US); Umesh K. Mishra, Santa Barbara, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/073,698

(22) Filed: Nov. 6, 2013

(65) Prior Publication Data
US 2014/0131730 A1 May 15, 2014

Related U.S. Application Data

(60) Provisional application No. 61/722,979, filed on Nov. 6, 2012, provisional application No. 61/722,982, filed on Nov. 6, 2012, provisional application No. 61/812,002, filed on Apr. 15, 2013.

(51) Int. Cl.

| H01L 33/32 | (2010.01) |
|---|---|
| H01L 21/02 | (2006.01) |
| H01L 33/00 | (2010.01) |
| H01L 31/0735 | (2012.01) |
| H01L 31/18 | (2006.01) |
| H01L 33/12 | (2010.01) |

(52) U.S. Cl.
CPC .......... *H01L 33/32* (2013.01); *H01L 21/02458* (2013.01); *H01L 33/007* (2013.01); *H01L 33/12* (2013.01); *H01L 21/0254* (2013.01); *H01L 21/02639* (2013.01); *H01L 21/0265* (2013.01); *H01L 31/0735* (2013.01); *H01L 31/1856* (2013.01); *Y02E 10/544* (2013.01)

(58) Field of Classification Search
CPC ..... H01L 33/0075; H01L 33/32; H01L 33/30; H01L 33/0062; H01L 33/007; H01L 33/12; H01L 21/0254; H01L 21/02639; H01L 21/0265; H01L 21/02458; H01L 31/0735; H01L 31/1856; Y02E 10/544
USPC .................. 257/76, 94, 615; 438/47, 46, 478
See application file for complete search history.

(56) References Cited

U.S. PATENT DOCUMENTS

| 2011/0284863 A1* | 11/2011 | Lindow et al. ................. 257/76 |
| 2012/0091465 A1* | 4/2012 | Krames et al. ................. 257/76 |

OTHER PUBLICATIONS

O'Donnell et al., "Structural analysis of InGaN epilayers", 2001, J. Phys. Condend. Matter, vol. 13, pp. 6877-6991, published on Jul. 26, 2004.*

(Continued)

*Primary Examiner* — Nikolay Yushin
(74) *Attorney, Agent, or Firm* — Gates & Cooper LLP

(57) ABSTRACT

A method of fabricating a heterostructure device, including (a) obtaining a first layer or substrate; (b) growing a second layer on the first layer or substrate; and (c) forming the second layer that is at least partially relaxed wherein (1) the first layer and the second layer have the same lattice structure but different lattice constants, (2) the first layer and the second layer form a heterojunction, and (3) the heterojunction forms an active area of a device or serves as a pseudo-substrate for the device.

23 Claims, 27 Drawing Sheets

(56) References Cited

OTHER PUBLICATIONS

Shen, Y.C., et al., "Auger recombination in InGaN measured by photoluminescence", Applied Physics Letters, 2007, pp. 141101-1-141101-3, vol. 91.

Farrell, R.M., et al., "High quantum efficiency InGaN/GaN multiple quantum well solar cells with spectral response extending out to 520 cm", Applied Physics Letters, 2011, pp. 201107-1-201107-3, vol. 98.

Neufeld, C.J., et al., "High quantum efficiency InGaN/GaN solar cells with 2.95 eV band gap", Applied Physics Letters, 2008, pp. 143502-1-143502-3, vol. 93.

Bottcher, T., et al., "The role of high-temperature island coalescence in the development of stresses in GaN films", Applied Physics Letters, Apr. 2, 2001, pp. 1976-1978, vol. 78, No. 14.

Keller, S., et al., "Optical and structural properties of GaN nanopillar and nanostripe arrays with embedded InGaN/GaN multi-quantum wells", Journal of Applied Physics, 2006, pp. 054314-1-054314-7, vol. 100.

Gudiksen, M.S., et al., "Growth of nanowire superlattice structures for nanoscale photonics and electronics", Nature, Feb. 7, 2002, pp. 617-620, vol. 415.

Matthews, J.W., et al., "Defects in Epitaxial Multilayers", Journal of Crystal Growth, 1974, pp. 118-125, vol. 27.

Luryi, S., et al., "New approach to the high quality epitaxial growth of lattice-mismatched materials", Applied Physics Letters, Jul. 21, 1986, pp. 140-142, vol. 49, No. 3.

Zubia, D., et al., "Nanoheteroepitaxy: The Application of nanostructuring and substrate compliance to the heteroepitaxy of mismatched semiconductor materials", Journal of Applied Physics, May 1, 1999, pp. 6492-6496, vol. 85, No. 9.

Bjork, M.T., et al., "Nanowire resonant tunneling diodes", Applied Physics Letters, Dec. 2, 2002, pp. 4458-4460, vol. 81, No. 23.

Kumakura, K., et al., "Mg-acceptor activation mechanism and transport characteristics in p-type InGaN grown by metalorganic vapor phase epitaxy", Journal of Applied Physics, Mar. 15, 2003, pp. 3370-3375, vol. 93, No. 6.

Sharma, T.K., et al., "Application-oriented nitride substrates: The key to long-wavelength nitride lasers beyond 500 nm", Journal of Applied Physics, 2010, pp. 024516-1-024516-11, vol. 107.

David, A., et al., "Droop in InGaN light-emitting diodes: A differential carrier lifetime analysis", Applied Physics Letters, 2010, pp. 103504-1-103504-3, vol. 96.

Keller, S., et al., "Optical properties of GaN nanopillar and nanostripe arrays with embedded InGaN/GaN multi quantum wells", Phys. Stat. Sol. (b), 2007, pp. 1797-1801, vol. 244, No. 6.

Yayama, T., et al., "Theoretical analyses of In incorporation and compositional instability in coherently grown InGaN thin films", Phys. Status Solidi C, 2010, pp. 2249-2251, vol. 7, No. 7-8.

Lang, J.R., "Growth and Physics of III-N Based Solar Cells by Ammonia Molecular Beam Epitaxy", Dissertation, Sep. 2012, UCSB.

Daeubler, J., et al., Growth and Characterization of Metamorphic GaInN-on-GaN Buffer Layers with Enlarged In-Plane Lattice Parameter as Template for Strain-Engineered Long Wavelength GaInN QW Emitters, Presentation, Aug. 27, 2013, International Conference on Nitride Semiconductors ICNS10.

O'Donnell, K.P., et al., "Structural analysis of InGaN epilayers", Journal of Physics: Condensed Matter, 2001, pp. 6977-6991, vol. 13.

\* cited by examiner

(IN,GA,AL)N OPTOELECTRONIC DEVICES GROWN ON RELAXED (IN,GA,AL)N-ON-GAN BASE LAYERS

CROSS REFERENCE TO RELATED APPLICATIONS

This application claims the benefit under 35 U.S.C. Section 119(e) of the following and commonly-assigned applications:

U.S. Provisional Application Ser. No. 61/722,979 filed on Nov. 6, 2012, by Stacia Keller, Carl J. Neufeld, Steven P. DenBaars, and Umesh K. Mishra, entitled "(IN,GA,AL)N OPTOELECTRONIC DEVICES GROWN ON RELAXED C-PLANE (IN,GA,AL)N-ON-GAN BASE LAYERS,"; and U.S. Provisional Application Ser. No. 61/722,982 filed on Nov. 6, 2012, by Stacia Keller, Carl J. Neufeld, Steven P. DenBaars, and Umesh K. Mishra, entitled "METHOD FOR THE FABRICATION OF RELAXED HETEROJUNCTIONS";

U.S. Provisional Application Ser. No. 61/812,002 filed on Apr. 15, 2013, by Stacia Keller, Carl J. Neufeld, Steven P. DenBaars, and Umesh K. Mishra, entitled "METHOD FOR THE FABRICATION OF RELAXED HETEROJUNCTIONS";

all of which applications are incorporated by reference herein.

This application is related to U.S. Provisional Application Ser. No. 61/586,338, filed on Jan. 13, 2012, by Stacia Keller, Carl J. Neufeld, and Umesh K. Mishra, entitled "METHOD FOR THE FABRICATION OF RELAXED HETEROJUNCTIONS,", which application is incorporated by reference herein.

BACKGROUND OF THE INVENTION

1. Field of the Invention

This invention relates to devices and compositions comprising relaxed heterojunctions, and methods of use and fabrication thereof.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

The alloy system (Al,Ga,In)N, for example, is a direct band gap system with a band gap ranging from 6.1 eV, for AlN, to 0.7 eV, for InN. The lattice mismatch between AlN and InN is, however, as large as 13%, with 10% mismatch between GaN and InN. Expanding the operation range of (Al,Ga,In)N devices into the green, yellow and red range of the electromagnetic spectrum is therefore complicated by an extremely large lattice mismatch when GaN is considered as the substrate. To date, however, only bulk GaN substrates are available, and only a few attempts have been undertaken to fabricate thick InGaN layers on GaN as alloy substrates, because of difficulties in the growth of InGaN using the typical substrate growth method, Hydride Vapor Phase Epitaxy (HVPE). In addition, certain applications, for example multi junction solar cells, require vertical stacking of relatively thin layers with large differences in their lattice constant. For all lattice mismatched systems, the critical thickness of a mismatched layer, representing the maximum thickness for the deposition of a defect free layer, is inversely proportional to the lattice mismatch [1]. For $In_{0.3}Ga_{0.7}N$ on GaN, for example, the critical thickness was estimated to be below 3 nm. In addition, when grown in the typical c-direction, the large lattice mismatch between GaN and InGaN layers is accompanied by the existence of large polarization fields in the crystal, which result in electron hole separation in InGaN/GaN quantum wells, reducing the recombination probability of excitons. Since, in the typical Ga-polar InGaN/GaN heterojunction light emitting devices, the internal polarization field is directed in the opposite direction than the externally applied electric field, further problems arise, in particular for solar cell applications. In all cases, a reduction in the lattice mismatch between the active area of the device and the surrounding layers would greatly expand device design opportunities.

SUMMARY OF THE INVENTION

One or more embodiments described in the application allow the fabrication of heterojunctions comprised of relaxed layers of crystals with the same lattice structure but different lattice constants, which can either form the active area of a device or can serve as pseudo-substrates. Previously, the fabrication of a heterojunction was limited to the combination of layers with either the same lattice constants, or layers where the thickness of the lattice mismatched layer did not exceed its critical thickness. One or more of the embodiments disclosed here can break this restriction through nano-segmentation. In such embodiments, a coherently strained mismatched layer is first grown within the critical thickness limits. The layer is then etched into nano-segments resulting in relaxation of the previously strained layer. In the following step, the nanosegments are merged and the growth of the now relaxed lattice mismatched layer is continued. The process can be repeated multiple times, gradually increasing or decreasing the lattice constants of the individual layers. One or more embodiments disclosed in the present application can be used for all applications where a combination of layers with large lattice mismatch is desired, for example green, yellow and red GaN based light emitting diodes, laser structures, and solar cells (particularly multi junction solar cells). However, embodiments disclosed in this application can be applied to all crystals with a common crystal structure, but different lattice constants.

For example, the present application discloses a method of fabricating a heterostructure device, comprising (a) obtaining a first layer or substrate; (b) growing a second layer on the first layer or substrate; and (c) forming the second layer that is at least partially relaxed wherein (1) the first layer and the second layer have the same lattice structure but different lattice constants, (2) the first layer and the second layer form a heterojunction, and (3) the heterojunction forms an active area of a device or serves as a pseudo-substrate for the device.

The first layer can be GaN and the second layer (e.g., one or more quantum wells) can be a nitride containing Indium, Gallium, or Indium and Gallium.

The method can further comprise growing the second layer as a coherently strained second layer, within critical thickness limits for the second layer; forming the second layer comprising etching the coherently strained second layer into segments having up to a 1000 micrometer width; and continuing growth of, or re-growing, the second layer, wherein the segments are merged or coalesced.

The method can further comprise repeating the steps using the re-grown or coalesced second layer as the first layer, wherein the segments comprise stripes; changing an orientation of the stripes of the layers in the subsequently deposited heterojunctions to obtain the 2-dimensional relaxation; and gradually increasing or decreasing the lattice constants of the layers in the subsequently deposited heterojunctions.

The method can further comprise coalescing the segments with a coherently strained coalescence layer, wherein the coalescing is initiated by raising a temperature above a temperature used to grow the coherently strained coalescence layer prior to continuing the growth of the second layer.

The method can further comprise depositing mask material at a bottom or at a bottom and on a top of the segments to promote coalescence of the segments, and after the segments are merged, (1) continuing growth of the second layer to overgrow masked areas masked by the mask material, thereby forming a continuous at least partially relaxed second layer, or (2) interrupting the growth, removing the mask material on the top of the segments, and continuing the growth of the second layer afterwards.

The method can further comprise growing the second layer as a coherently strained second layer, within critical thickness limits for the second layer; and forming the second layer, comprising (1) etching the coherently strained second layer into a pattern of stripes resulting in at least partial relaxation of the coherently strained second layer into at least partially relaxed stripes having up to a 1000 micrometer width; and (2) re-growing the second layer. The regrowing (2) can comprise (i) growing a GaN coalescence layer under one dimensional (1D) tensile strain on top of the stripe pattern, adopting an a-lattice constant of the stripes in the stripe pattern, and (ii) growing an InGaN layer on the GaN coalescence layer, wherein the InGaN layer adopts the a-lattice constant of the stripes and results in 1D relaxation of the InGaN layer. The method can further comprise patterning the InGaN layer in (ii) into stripes with an angle between 30 and 90 degrees with respect to the stripes in the second layer, resulting in full or partial two dimensional relaxation of the InGaN layer.

The method can further comprise growing the second layer as a coherently strained second layer, within critical thickness limits for the second layer; and forming the second layer, comprising (1) etching the coherently strained second layer into a pattern of segments resulting in at least 1-dimensional or 2-dimensional partial relaxation of the coherently strained second layer into at least partially relaxed segments having up to a 1000 micrometer width; and (2) continuing growth of, or re-growing, the second layer, wherein the segments are merged or coalesced.

The method can further comprise growing the second layer comprising a coherently strained second layer, within critical thickness limits for the second layer; and forming the second layer, comprising (1) etching the coherently strained second layer into segments resulting in at least partial relaxation of the coherently strained second layer into at least partially relaxed segments having up to a 1000 micrometer width; and (2) merging the segments by growing a coalescence layer composed of a material with a different composition than the coherently strained second layer.

The method can further comprise obtaining the first layer comprising a Gallium Nitride layer; depositing a mask material on the Gallium Nitride layer, wherein the mask material includes openings having a width up to 1000 micrometers; growing and forming the second layer comprising a relaxed III-nitride pillar in each of a plurality of the openings, to form a plurality of the III-nitride pillars, wherein the relaxed III-nitride pillars include Indium or Gallium or Indium and Gallium; and continuing growth of the III-nitride pillars, wherein the III-nitride pillars overgrow the openings to form a relaxed III-nitride film including Indium and/or Gallium, the Gallium Nitride layer and the relaxed III-nitride film have a same lattice structure but different lattice constants, the Gallium Nitride layer and the relaxed III-nitride film form a heterojunction, and the heterojunction forms an active area of a device or serves as a pseudo-substrate for the device.

The method can further comprise obtaining the first layer comprising a Gallium Nitride layer, and growing and forming the second layer comprising growing a plurality of relaxed III-nitride pillars on the Gallium Nitride (GaN) layer, wherein (1) the relaxed III-nitride pillars include Indium or Gallium or Indium and Gallium, and (2) the relaxed III-nitride pillars are selectively seeded on the GaN layer and have a width up to 1000 micrometers; and continuing growth of the relaxed III-nitride pillars, wherein the relaxed III-nitride pillars are merged, to form a relaxed III-nitride film including Indium and/or Gallium, the GaN layer and the relaxed III-nitride film have the same lattice structure but different lattice constants, the GaN layer and the relaxed III-nitride film form a heterojunction, and the heterojunction forms an active area of a device or serves as a pseudo-substrate for the device.

The method can further comprise obtaining the first layer comprising a III-nitride or GaN base layer; growing the second layer comprising: (i) depositing a strained $In_xGa_{1-x}N$ layer on top of the III-nitride or GaN base layer; (ii) depositing an $In_yGa_{1-y}N$ layer on the $In_xGa_{1-x}N$ layer to form a two layer stack, wherein the $In_yGa_{1-y}N$ layer is thicker than the $In_xGa_{1-x}N$ layer and y<x; (c) etching the two layer stack with a pattern to form etched features; (d) selectively etching the thinner $In_xGa_{1-x}N$ layer only, undercutting the thicker $In_yGa_{1-y}N$ layer in such a way that only a post remains, wherein the thicker $In_yGa_{1-y}N$ layer is detached from the base layer so that it can relax and adopt its unstrained lattice constant; and (e) growing an $In_zGa_{1-z}N$ layer on top of the $In_yGa_{1-y}N$ layer. The etched features can be merged by growth of the $In_zGa_{1-z}N$, leading to a relaxed (z=y) or partially relaxed (z≠y) $In_zGa_{1-z}N$ film with a lattice constant corresponding to the patterned relaxed $In_yGa_{1-y}N$ features. The pattern can comprise first stripes oriented in a first direction, the method further comprising repeating steps (a)-(e) wherein the $In_zGa_{1-z}N$ layer is the base layer for the next step (a); the strained $In_xGa_{1-x}N$ layer in the next step (a) is an $In_sGa_{1-s}N$ layer; the thicker $In_yGa_{1-y}N$ layer in the next step (b) is a $In_tGa_{1-t}N$ layer with s>t such that the $In_sGa_{1-s}N$ layer and the $In_tGa_{1-t}N$ layer form a coherently strained stack; the etching in the next step (c) is with the pattern comprising second stripes oriented in a second direction; the $In_zGa_{1-z}N$ layer in the next growing step (e) is fully relaxed for y=t=z or partially relaxed in the presence of small differences between y, t, and z; and x, y, z, t are compositions of Indium in the InGaN layers.

The method can further comprise obtaining the first layer comprising a III-nitride or GaN base layer; forming nano or micron sized or width openings on a surface of a GaN or III-nitride base layer; growing the second layer comprising (1) depositing a strained $In_xGa_{1-x}N$ layer into the openings only; and (2) depositing an $In_yGa_{1-y}N$ layer on the $In_xGa_{1-x}N$ layer to form a two layer stack, wherein the $In_yGa_{1-y}N$ layer is thicker than the $In_xGa_{1-x}N$ layer and y<x; selectively etching the thinner $In_xGa_{1-x}N$ layer only, undercutting the thicker $In_yGa_{1-y}N$ layer in such a way that only a nanometer sized post remains supporting the thicker $In_yGa_{1-y}N$ layer; and growing an $In_zGa_{1-z}N$ layer on top of the $In_yGa_{1-y}N$.

The method can further comprise growing the second layer comprising an InGaN bulk base layer; and growing an InGaN active region coherently on or above the InGaN bulk base layer, wherein (i) a thickness and Indium composition of the InGaN active region are larger than a thickness and Indium composition of an InGaN active region that is not grown on the InGaN bulk base layer, and (ii) the InGaN bulk base layer (a) is at least partially relaxed, and (b) has one or more lattice constants that match one or more lattice constants of the InGaN active region grown on the InGaN bulk base layer.

The method can further comprise growing the second layer comprising an n-type InGaN bulk base layer deposited on the first layer comprising a GaN substrate; and growing an InGaN active region coherently on or above the InGaN bulk base layer, wherein: (i) a thickness and Indium composition of the active region are larger than a thickness and Indium composition of an InGaN active region that is not grown on the InGaN bulk base layer; and (ii) the InGaN bulk base layer: (a) is at least partially relaxed, and (b) has one or more lattice constants that match one or more lattice constants of the InGaN active region grown on the InGaN bulk base layer; and (c) a p-type InGaN layer deposited on or above the InGaN active region.

The method can further comprise patterning the InGaN on the GaN substrate; and forming relaxed InGaN on the patterned InGaN, wherein the InGaN bulk base layer comprises the relaxed InGaN and the active region is deposited on the relaxed InGaN.

BRIEF DESCRIPTION OF THE DRAWINGS

Referring now to the drawings in which like reference numbers represent corresponding parts throughout:

FIG. 1 shows cross-sectional schematics of layer structures, illustrating a method of fabricating a device structure, comprising (a) growing a coherently strained layer $L_2$ on a relaxed layer $L_1$, (b) etching the strained layer $L_2$ or part of strained layer $L_2$ into nanofeatures, wherein the nanofeatures relax, (c) continuing deposition of the strained layer $L_2$ on the relaxed nanosegments, and (d) growing a device structure onto the relaxed layer $L_2$ (wherein layer $L_2$ serves as the new base layer), or repeating the process steps (a)-(c) (as illustrated in FIG. 2), wherein FIG. 1 is a schematic for the case where $a_2 > a_1$ ($a_2$ is the lattice constant of layer $L_2$ and $a_1$ is the lattice constant of layer $L_1$).

FIG. 2 shows cross-sectional schematics of layer structures, illustrating a method wherein the process of FIG. 1 is continued or repeated multiple times, wherein FIG. 2(a) illustrates starting with the structure of FIG. 1(c) to repeat the process, FIG. 2(b) illustrates growing a layer $L_3$ on relaxed layer $L_2$, FIG. 2(c) illustrates etching layer $L_3$ into nanofeatures, wherein layer $L_3$ relaxes after etching into the nanofeatures, and FIG. 2(d) illustrates continuing deposition of layer $L_3$ on the relaxed nanosegments.

FIG. 7 shows cross-sectional schematics of layer structures, illustrating a method comprising (a) growing layer $L_2$ coherently strained on layer $L_1$, (b) etching layer $L_2$ into nanofeatures, wherein layer $L_2$ relaxes after the etching into the nanofeatures, (c) depositing a mask material between the nanofeatures, and (d) continuing deposition of layer $L_2$, merging the nanofeatures and forming a relaxed layer, wherein FIG. 7 is a schematic for the case where $a_2 > a_1$ ($a_2$ is the lattice constant of layer 2 and $a_1$ is the lattice constant of layer 1).

FIG. 8 shows cross-sectional schematics of layer structures, illustrating a method comprising (a) growing layer $L_2$ coherently strained on layer $L_1$ and depositing a mask material on layer $L_2$, (b) etching layer $L_2$ into nanofeatures, wherein layer $L_2$ relaxes after the etching into nanofeatures, (c) depositing mask material between the nanofeatures, (d) continuing deposition of layer $L_2$ to merge the nanofeatures, wherein FIG. 8 is a schematic for the case where $a_2 > a_1$ ($a_2$ is the lattice constant of layer $L_2$ and $a_1$ is the lattice constant of layer $L_1$).

FIG. 26 shows cross-sectional schematics of layer structures, illustrating a method of fabricating a device structure, comprising (a) growing a coherently strained layer $L_2$ on a relaxed layer $L_1$, (b) etching the strained layer $L_2$ or part of strained layer $L_2$ into nanofeatures, wherein the nanofeatures relax, (c) continuing deposition of the strained layer $L_2$ on the relaxed nanosegments, and (d) growing a device structure onto the relaxed layer $L_2$ (wherein layer $L_2$ serves as the new base layer), or repeating the process steps (a)-(c) (as illustrated in FIG. 2), wherein FIG. 26 is a schematic for the case where $a_2<a_1$ ($a_2$ is the lattice constant of layer $L_2$ and $a_1$ is the lattice constant of layer $L_1$), e.g., where $L_2$ is AlGaN and $L_1$ is GaN.

DETAILED DESCRIPTION OF THE INVENTION

Figure 1:
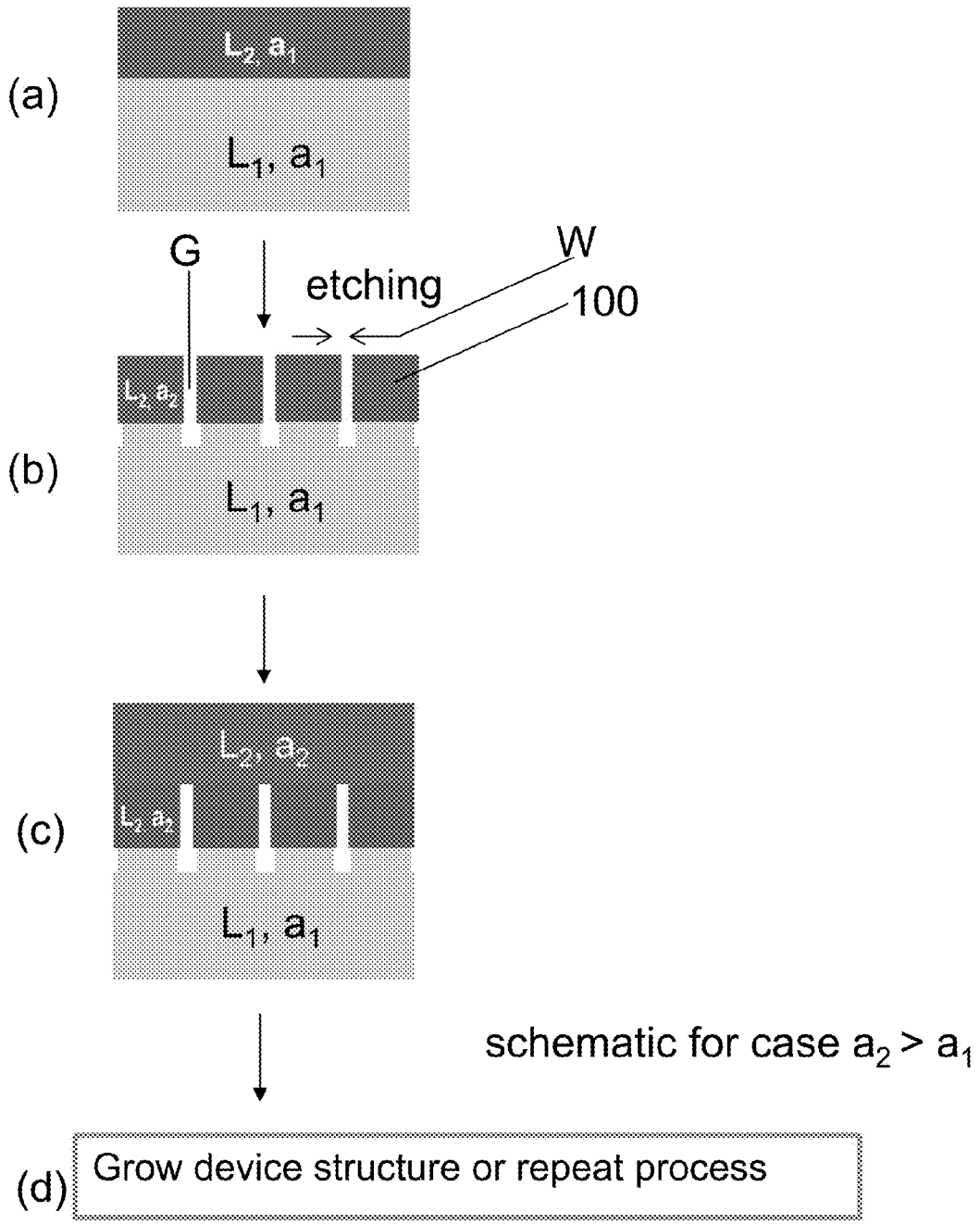

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Nomenclature

For a layer X grown on a layer Y, for the case of coherent growth, the in-plane lattice constant(s) of X are constrained to be the same as the underlying layer Y. If X is fully relaxed, then the lattice constants of X assume their natural (i.e. in the absence of any strain) value. If X is neither coherent nor fully relaxed with respect to Y, then it is considered to be partially relaxed. In some cases, the substrate might have some residual strain.

The equilibrium critical thickness corresponds to the case when it is energetically favorable to form misfit dislocations at the layer/substrate interface or other defects such as cracks, for example.

Experimental, or kinetic critical thickness, is always somewhat or significantly larger than the equilibrium critical thickness. However, regardless of whether the critical thickness is the equilibrium or kinetic critical thickness, the critical thickness corresponds to the thickness where a layer transforms from fully coherent to partially relaxed.

Another example of the critical thickness is the Matthews Blakeslee critical thickness $h_c$ [1].

The terms "(AlInGaN)" "(In,Al)GaN", or "GaN" as used herein (as well as the terms "III-nitride," "Group-III nitride", or "nitride," used generally) refer to any alloy composition of the (Ga,Al,In,B)N semiconductors having the formula $Ga_wAl_xIn_yB_zN$ where $0\leq w\leq 1$, $0\leq x\leq 1$, $0\leq y\leq 1$, $0\leq z\leq 1$, and $w+x+y+z=1$. These terms are intended to be broadly construed to include respective nitrides of the single species, Ga, Al, In and B, as well as binary, ternary and quaternary compositions of such Group III metal species. Accordingly, it will be appreciated that the discussion of the invention(s) hereinafter in reference to GaN and InGaN materials is applicable to the formation of various other (Ga,Al,In,B)N material species. Further, (Ga,Al,In,B)N materials within the scope of the invention(s) may further include minor quantities of dopants and/or other impurity or inclusional materials.

Many (Ga,Al,In,B)N devices are grown along the polar c-plane of the crystal, although this results in an undesirable quantum-confined Stark effect (QCSE), due to the existence of strong piezoelectric and spontaneous polarizations. One approach to decreasing polarization effects in (Ga,Al,In,B)N devices is to grow the devices on nonpolar or semipolar planes of the crystal.

The term "nonpolar plane" includes the {11-20} planes, known collectively as a-planes, and the {10-10} planes, known collectively as m-planes. Such planes contain equal numbers of Group-III (e.g., gallium) and nitrogen atoms per plane and are charge-neutral. Subsequent nonpolar layers are equivalent to one another, so the bulk crystal will not be polarized along the growth direction.

The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero 1 Miller index. Subsequent semipolar layers are equivalent to one another, so the crystal will have reduced polarization along the growth direction.

Technical Description

One or more embodiments described in the present application allow the fabrication of heterostructures comprising of individual, high crystal quality relaxed layers with different lattice constants, which were previously impossible to fabricate without introducing crystal defects. Thereby, one or more embodiments described in the present disclosure enable the fabrication of pseudo-substrates with specific, desired lattice constants.

An alternative approach to the fabrication of heterostructures with large lattice mismatch has been opened through the fabrication of nanostructures. Experiments conducted in a variety of systems have shown that lattice mismatch related obstacles can be overcome in nanowires. Defect free nanowires composed of GaAs/GaP superlattices [2] and InAs/InP tunnel junctions have been successfully demonstrated [3]. More recently, the inventors, and others, have also shown that coherently strained planar heterostructures relax when transformed into nanopillars through etching [4].

Example 1

This behavior is utilized for the fabrication of heterostructures comprised in part of relaxed layers (the active layers of the device can still be strained with respect of the underlayer) with different lattice constants, as illustrated in FIG. 1 and described below.

FIG. 1(a) illustrates that a layer $L_2$ (with a lattice constant $a_2$) is first deposited on a relaxed base layer or substrate $L_1$ (with a lattice constant $a_1$), in such a way that the layer $L_2$ is coherently strained and the lattice constant of the strained layer $L_2$ is still equal to $a_1$, the lattice constant of the layer $L_1$ beneath.

The sample is then removed from the growth chamber and layer $L_2$ is etched into nanosegments/nanofeatures which relax in the process, adopting the lattice constant $a_2$, as shown in FIG. 1(b). Thus, layer $L_2$ relaxes after etching into nanofeatures.

FIG. 1(c) illustrates that the deposition of layer $L_2$ is then continued on the relaxed nanosegments, merging the relaxed nanosegments, resulting in a planar, relaxed layer $L_2$ with the lattice constant $a_2$.

Figure 2:
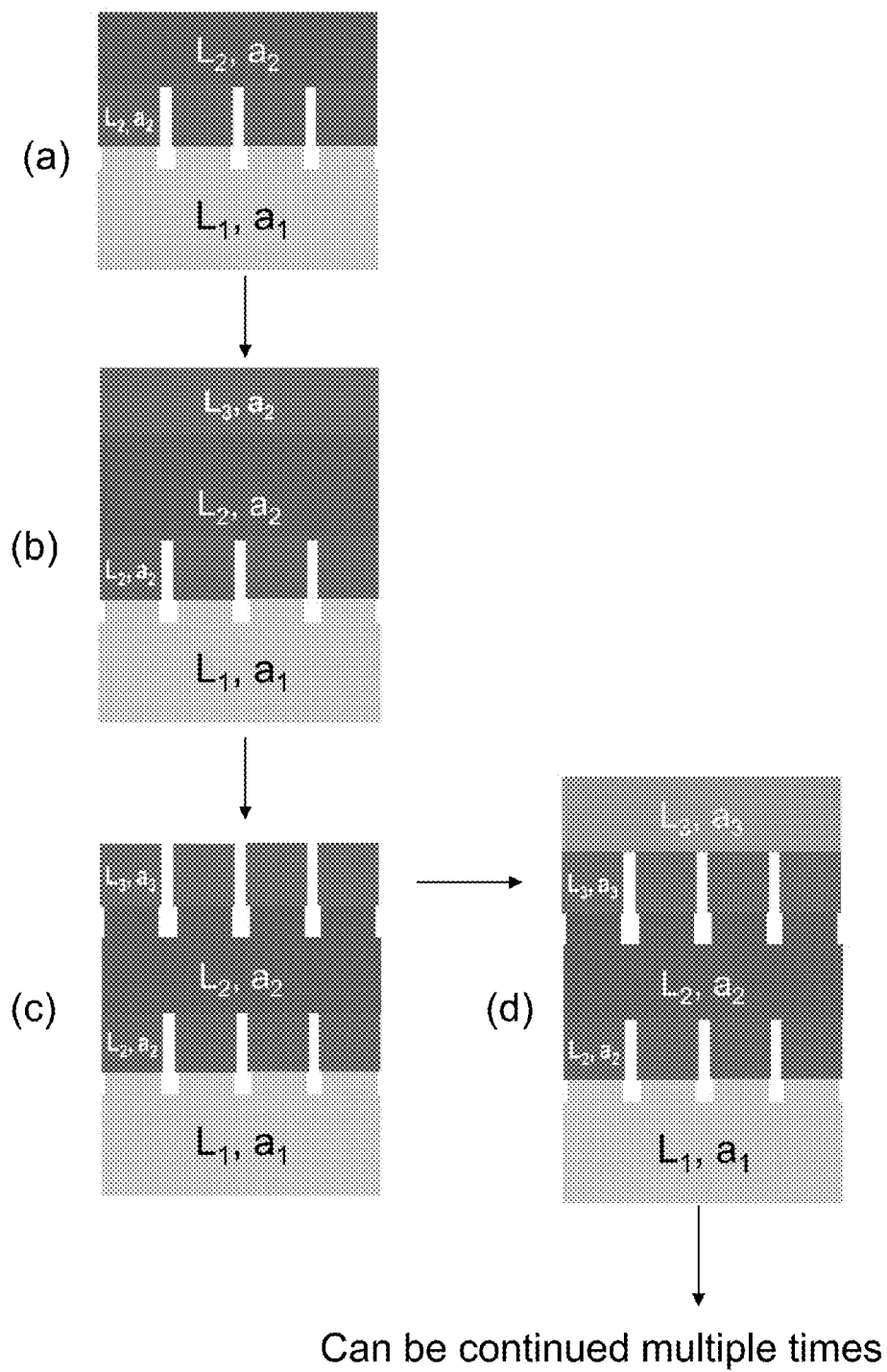

FIG. 1(d) illustrates growing a device structure onto relaxed layer $L_2$ (wherein layer $L_2$ serves as the new base layer), or repeating the process steps illustrated in FIGS. 1(a)-(c), as illustrated in FIG. 2.

FIG. 2 illustrates the process can be repeated multiple times, creating a stack of layers $L_n$ (n is an integer $0<n\leq n+1$ indexing the layer number) with varying lattice constant $a_n$.

Specifically, FIG. 2 illustrates a method wherein the process of FIG. 1 is continued or repeated multiple times. FIG. 2(a) illustrates starting with the structure of FIG. 1(c) to repeat the process, FIG. 2(b) illustrates growing a layer 3 ($L_3$), having lattice constant $a_3$, on relaxed layer $L_2$, FIG. 2(c) illustrates etching layer 3 into nanofeatures, wherein layer $L_3$ relaxes after etching into the nanofeatures, and FIG. 2(d) illustrates continuing deposition of layer $L_3$ on the relaxed nanosegments. When $a_n > a_{n-1}$ or $a_n < a_{n-1}$, the lattice constant can be stepwise increased or decreased, respectively.

Example 2

In an example comprising InGaN growth on GaN, the fabrication process starts with the growth of a coherently strained InGaN layer $L_2$ on a GaN template corresponding to $L_1$ (as illustrated in FIG. 1(a)). For example, $L_2$ can be a 120 nm thick $In_{0.15}Ga_{0.85}N$ layer, wherein the 120 nm thickness is close to the critical thickness for $In_{0.15}Ga_{0.85}N$.

Figure 3:
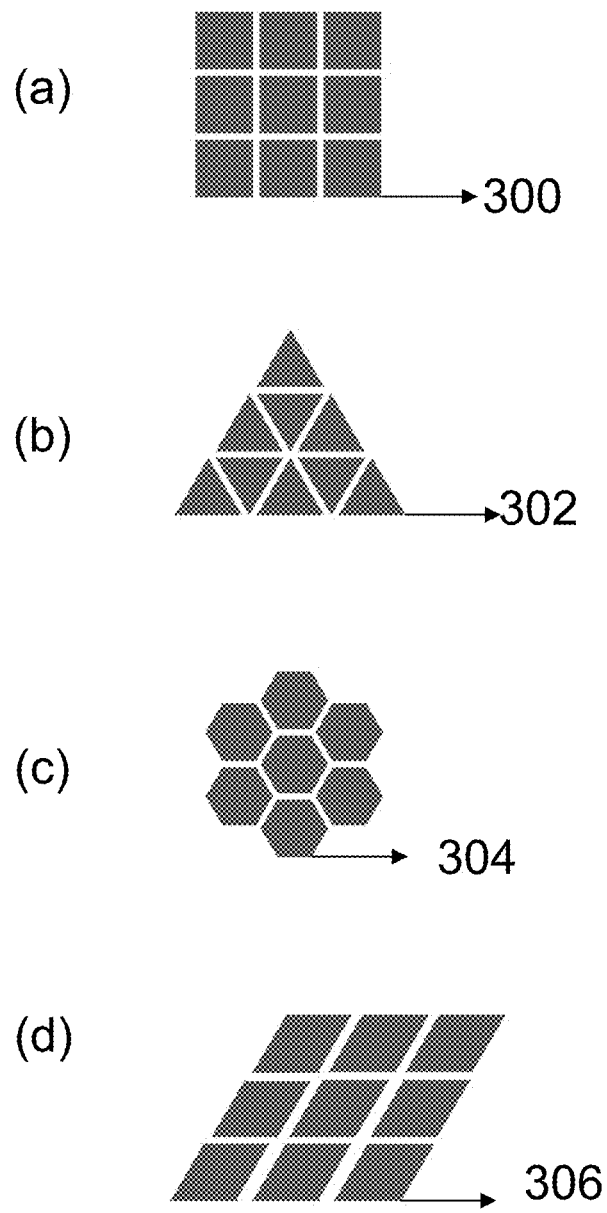
FIG. 3 is a top view of the nanosegments, illustrating an array of nanosegments with gaps between individual segments to ease the later merging process, wherein (a) illustrates segments with rectangular/square shape, (b) illustrates nanosegments with triangular shape, (c) illustrates nanosegments with hexagonal shape, and (d) illustrated nanosegments with rhombohedral shape.

The sample is then removed from the growth chamber and $L_2$ is etched into nanosegments 100, etching through the entire $In_{0.15}Ga_{0.85}N$ layer (as illustrated in FIG. 1(b)). The width W of the nanosegments must be of the order of, or smaller than, the InGaN layer $L_2$'s thickness, to allow relaxation. The nanosegments preferentially form a dense array with narrow gaps G between individual segments to ease the later merging process, as illustrated in FIG. 3. FIG. 3 shows rectangular/square nanosegments 300 with rectangular/square shape, triangular nanosegments 302 with triangular shape, hexagonal nanosegments 304 hexagonal shape, rhombohedral nanosegment 306 with rhombohedral shape.

The preferred feature geometry is dictated by the crystal structure. In the case of hexagonal c-plane (Al,Ga,In)N, triangular, rhombohedral, or hexagonal features are preferred as they allow crystallographic alignment, with a preferred orientation of the sides parallel to the [1-100] direction of the GaN crystal, leading to {11-20} sidewalls of the triangular or hexagonal nanosegments.

After nanopatterning, the sample is re-loaded into the reactor and the growth of $In_{0.15}Ga_{0.85}N$ continued, which now grows in a relaxed way, without any strain related limitations regarding its layer thickness (as illustrated in FIG. 1(c)). For device applications, all layers can be doped n-type to allow contact formation either to the bottom or the re-grown InGaN layer(s). If desired, the process can be continued starting a new cycle comprising (1) growing an about 100 nm thick strained $In_{0.25}Ga_{0.75}N$ layer on top of the relaxed $In_{0.15}Ga_{0.85}N$ layer, sample removal, (2) etching of the $In_{0.25}Ga_{0.75}N$ layer, sample reloading, and (3) deposition of a relaxed $In_{0.25}Ga_{0.78}N$ layer, and so forth and so on. Once the desired layer composition is established, the device structure can be completed.

Finishing with $In_{0.25}Ga_{0.75}N$, the lattice mismatch to, for example, an $In_{0.3}Ga_{0.7}N$ layer or quantum well would be less than 10%, corresponding to the mismatch in a device structure emitting in the violet to blue. For applications in optoelectronic devices, the fabrication process can be finished with the deposition of a p-type InGaN layer. As the active area of the device structure is planar, standard processing techniques can be applied for device processing. The advantages of using InGaN instead of GaN as a base layer for optoelectronic devices has been discussed in detail in ref. [8]. In addition, a reduced lattice mismatch has been shown to enhance the In incorporation into the films during epitaxy [6].

InGaN/GaN heterostructures can be grown and processed according to the procedure described above. Embodiments disclosed herein can then be applied to, for example, solar cells operating in the 500-600 nm range of the electromagnetic spectrum.

The described method applies to all groups of solids which crystallize in the same crystal structure, and where the group constituents distinguish in their specific lattice constants. Well known examples are III-V semiconductors such as the cubic (Al,Ga,In)(P,As,Sb) system or (Al,Ga,In)N with a hexagonal lattice structure. (Mg,Zn,Cd)O or (Ba,Sr)TiO$_3$, or Si and Ge elemental semiconductors are other examples. Often, devices require the fabrication of heterostructures composed of individual constituents from each group. Thereby, the device design is typically limited to the combination of materials with similar lattice constants, as combination of materials with a large lattice mismatch results in the formation of crystal defects.

The following modifications/examples are also included as embodiments of the present invention.

Example 3

If desired, instead of etching through the entire coherently strained layer $L_2$, e.g., the 120 nm thick $In_{0.12}Ga_{0.82}N$ or $In_{0.15}Ga_{0.85}N$ layer in Example 2, only part of the layer is etched, and only the etched part of the layer will undergo relaxation.

Example 4

Any individual layers $L_n$ can be replaced by multi-layer-stacks (multi quantum wells, superlattices), which are now characterized by an average lattice constant of the individual stack (as seen in [4])

Example 5

During coalescence of the nanofeatures, tensile stress may evolve due to "grain snapping" at the coalescence fronts [7]. This process can be mitigated by a slight off-set in the composition between patterned and re-grown layer. For example, if the patterned layer is $In_{0.15}Ga_{0.85}N$, the patterns can be coalesced by growing $In_{0.14}Ga_{0.86}N$ and continuing the layer growth with $In_{0.14}Ga_{0.86}N$.

Example 6

Figure 4:
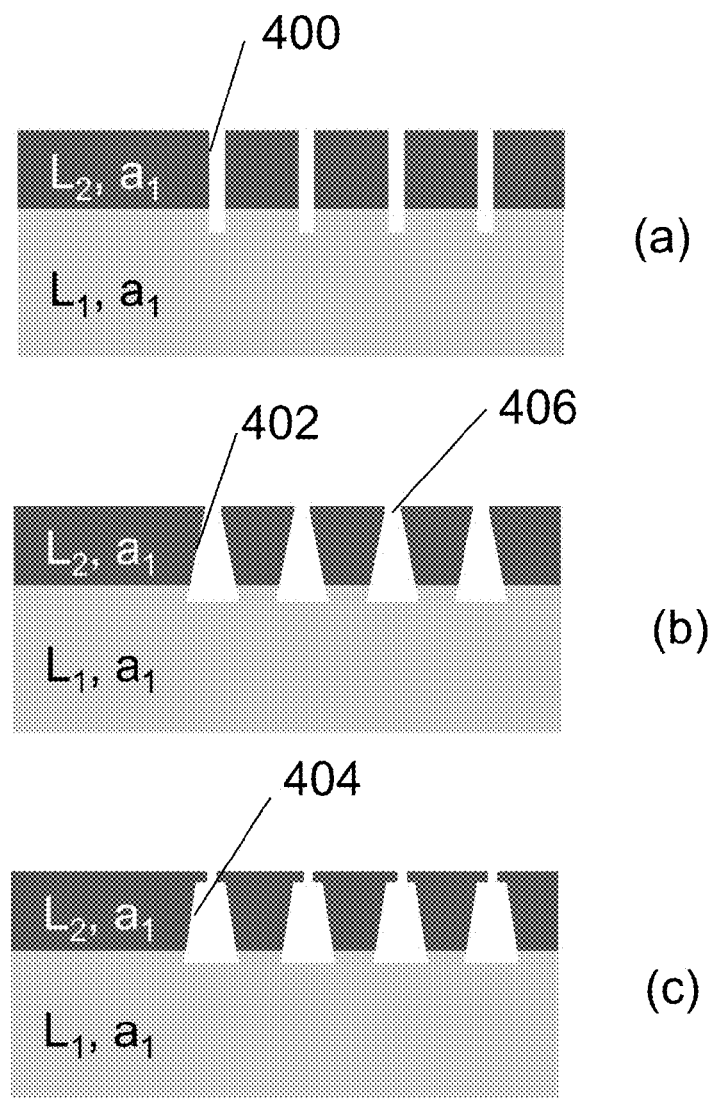
FIG. 4 illustrates the etching profile can be straight, as shown in (a) or inclined, wherein a tapered etching profile as illustrated in (b) and (c).

If desired, part of the layer $L_n$ or stack can be a strained layer with respect to the lattice constant $a_n$ of the relaxed bulk of the layer $L_n$ or stack. For example, if advantageous for achieving an undercut during etching (as shown in FIG. 4(c)), a thin top layer distinguishing in composition from, and exhibiting different etching properties than, the main layer can be implemented.

Example 7

If relaxation is desired to occur only in one lateral direction, the 3 dimensional pillars described above can be replaced by stripes [4, 5].

Example 8

The etching profile can be straight 400 or inclined 402, 404, or with undercut, as displayed in FIG. 4(a)-(c), for example. A tapered etching profile 402, 404 as illustrated in FIGS. 4(b) and 4(c) has the advantage that the minimum width of the final feature 406 is smaller than the original pattern width.

While less desirable, tapering resulting in wider features in the bottom can be applied as well.

Example 9

If desired, the feature size and geometry can be chosen in such a way that additional effects, such as light extraction/or absorption via photonic crystals can be utilized.

Example 10

The feature size and geometry can vary laterally to achieve lateral modulation of the crystal properties, for example layer strain variation or lateral photonic crystal design.

Example 11

The nanofeatures can be of random shape and arranged randomly and created by other methods, for example, using anodic oxidation for pattern definition.

Example 12

Figure 5:
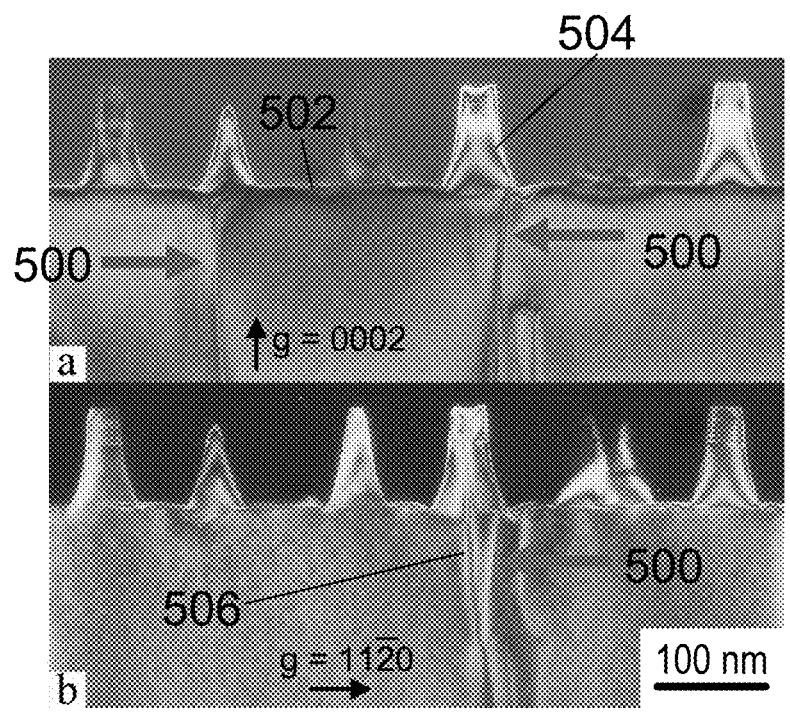
FIG. 5 illustrates the etching into nanosegments can lead to dislocation bending and threading dislocation reduction in the top layers, wherein due to surface image forces, the threading dislocation bends to the surface and does not propagate into the pillar, as shown in (a) by the arrows, and only the threading dislocation located in center of pillar continues propagation, as shown in (b) by the arrow.

The etching into nanosegments can lead to dislocation bending and threading dislocation reduction in the top layers, as illustrated in FIG. 5. Due to surface image forces, the threading dislocation 500 bends to the surface 502 and does not propagate into the pillar 504. Only threading dislocation 506 located in center of pillar 504 continues propagation.

Figure 6:
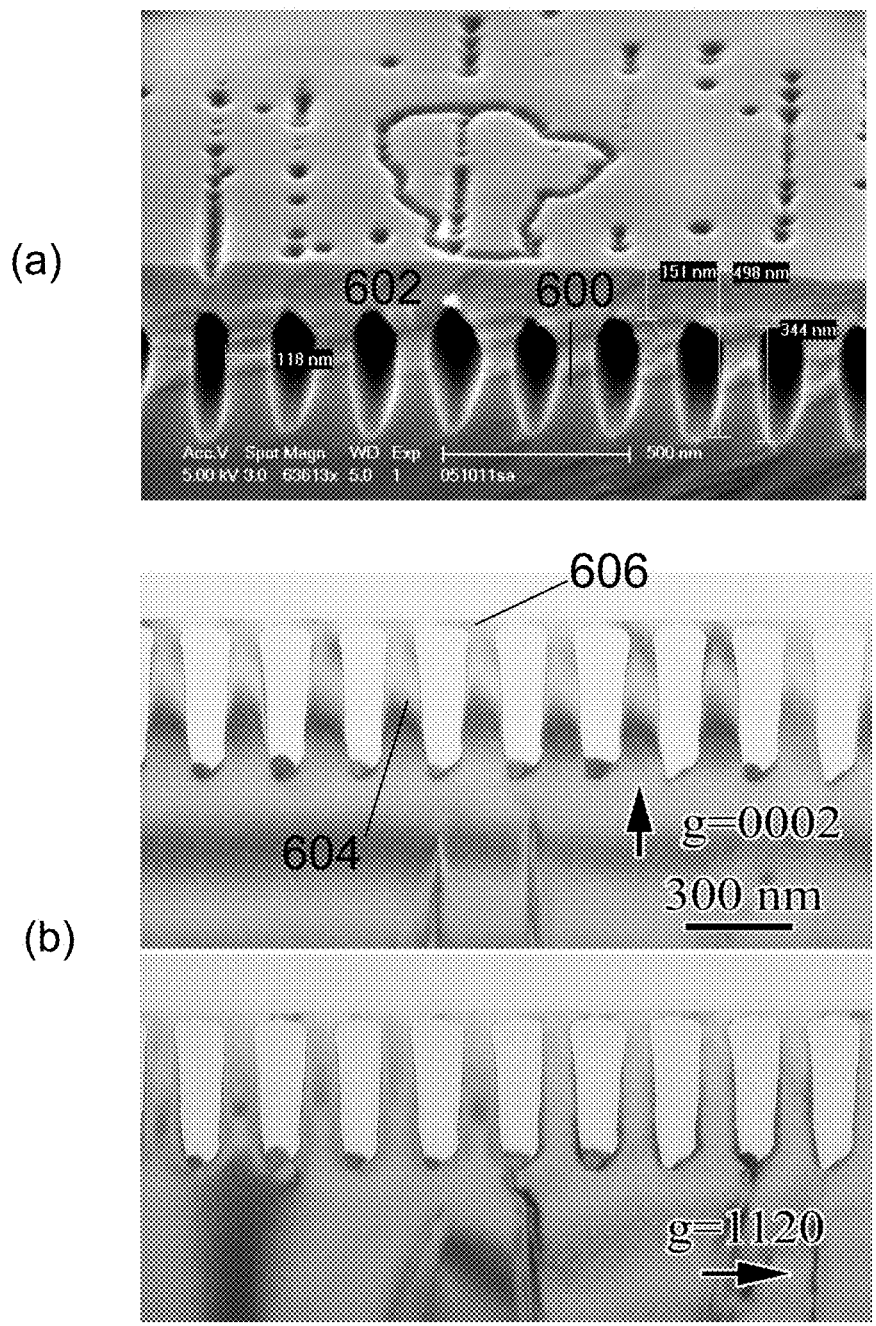
FIG. 6 shows (a) a Scanning Electron Microscope (SEM) image illustrating stripes with an embedded InGaN Multi Quantum Well (MQW) and an InGaN top layer grown by MOCVD, and (b) a Transmission Electron Microscope (TEM) image illustrating GaN stripes and GaN coalescence layer grown by MBE.

FIG. 6 shows (a) an SEM image of stripes 600 with embedded InGaN MQW and InGaN top layer 602 grown by Metal Organic Vapor Deposition (MOCVD). FIG. 6(b) shows a TEM image of GaN stripes 604 and GaN coalescence layer 606 grown by Molecular Beam Epitaxy (MBE).

Example 13

Instead of etching 3 dimensional features, relaxation of layer $L_{n+1}$ can be achieved through repeated etching, merging and continued growth of 2 dimensional stripe arrays, where the stripe orientation changes in each individual step.

Example 14

Instead of growing layers where the lattice constant of the coalesced layer is identical to those of the relaxed nanofeatures underneath, a layer with a slightly different lattice constant can be grown to fabricate a stack of layers with a small strain gradient to, for example, accommodate thermal strain in the stack.

Example 15

Instead of fabricating nanofeatures with narrow gaps between the individual features, the nanofeatures 700 can be positioned further apart 702, as shown in FIG. 7(b), and a mask material 704, for example $Si_3N_4$ or amorphous AlN, can be deposited between features 700, as shown in FIG. 7(c). Thereby, the mask layer or material 704 can be deposited only at the bottom of the features 700, or fill in the gaps between the features 700 entirely, leaving only the feature 700 surface 706 open. In this approach, the layer $L_2$ is grown in such a way that it seeds at the etched relaxed nanofeatures, and overgrows the masked regions with its natural relaxed lattice constant $a_2$, as illustrated in FIG. 7(d).

Example 16

A possible process flow is illustrated in FIG. 8(a)-(d), for example, which shows the mask material 800a-b and nanosegments 802.

Similar to Example 15, mask material 800a can be deposited at the bottom 800a and on the top 800b of the nanofeatures or nanosegments 802 to promote their coalescence, as shown in FIG. 8(a)-(c). After merging of the nanofeatures or nanosegments, the growing layer will overgrow the masked areas forming a continuous layer $L_2$, as shown in FIG. 8(d).

Alternatively, the growth can be interrupted after merging of the nanofeatures 802 to remove the top mask patches 800b, and the growth of the layer $L_2$ continued afterwards.

Example 17

Instead of segmenting a coherently strained layer $L_n$ into nanofeatures, allowing their relaxation, relaxed nanofeatures can be grown directly on top on the underlayer and merged through a change in the deposition conditions, leading again to a planar, relaxed film. A mask material may be used for this purpose. For example, a porous $Al_2O_3$ layer can be deposited on top of the GaN template. Afterwards, relaxed InGaN pillars are grown into the openings. During continued deposition, the InGaN overgrows the porous $Al_2O_3$ merging into a relaxed film. As an alternative to porous $Al_2O_3$, any uniform mask layer, for example $Si_3N_4$ or amorphous AlN, can be deposited onto the GaN substrate, and nano-openings formed in the mask layer. Relaxed InGaN can then be deposited inside the nano-openings. During continued deposition, the InGaN overgrows the mask material and forms a relaxed InGaN film. Alternately, the nanofeatures can be selectively seeded by other methods, for example droplet epitaxy or metal catalyzed epitaxy [2].

The methods practiced via Example 15 and Example 16 are very similar to GaN Epitaxial Lateral Growth, with the difference that the methods practiced via Examples 15 and Example 16 employ nanoscale seed features and involve the deposition of materials with different lattice constants.

Example 18

As discussed in Example 5, the processes described in Example 15 and Example 16 can be modified in such a way that a slight composition off-set is applied between individual nanofeatures and the coalesced layer. For example, when the nanofeatures grown on the GaN template are composed of $In_{0.15}Ga_{0.85}N$, the composition can be changed to $In_{0.14}Ga_{0.86}N$ after the nanofeatures have merged.

Example 19

Figure 9:
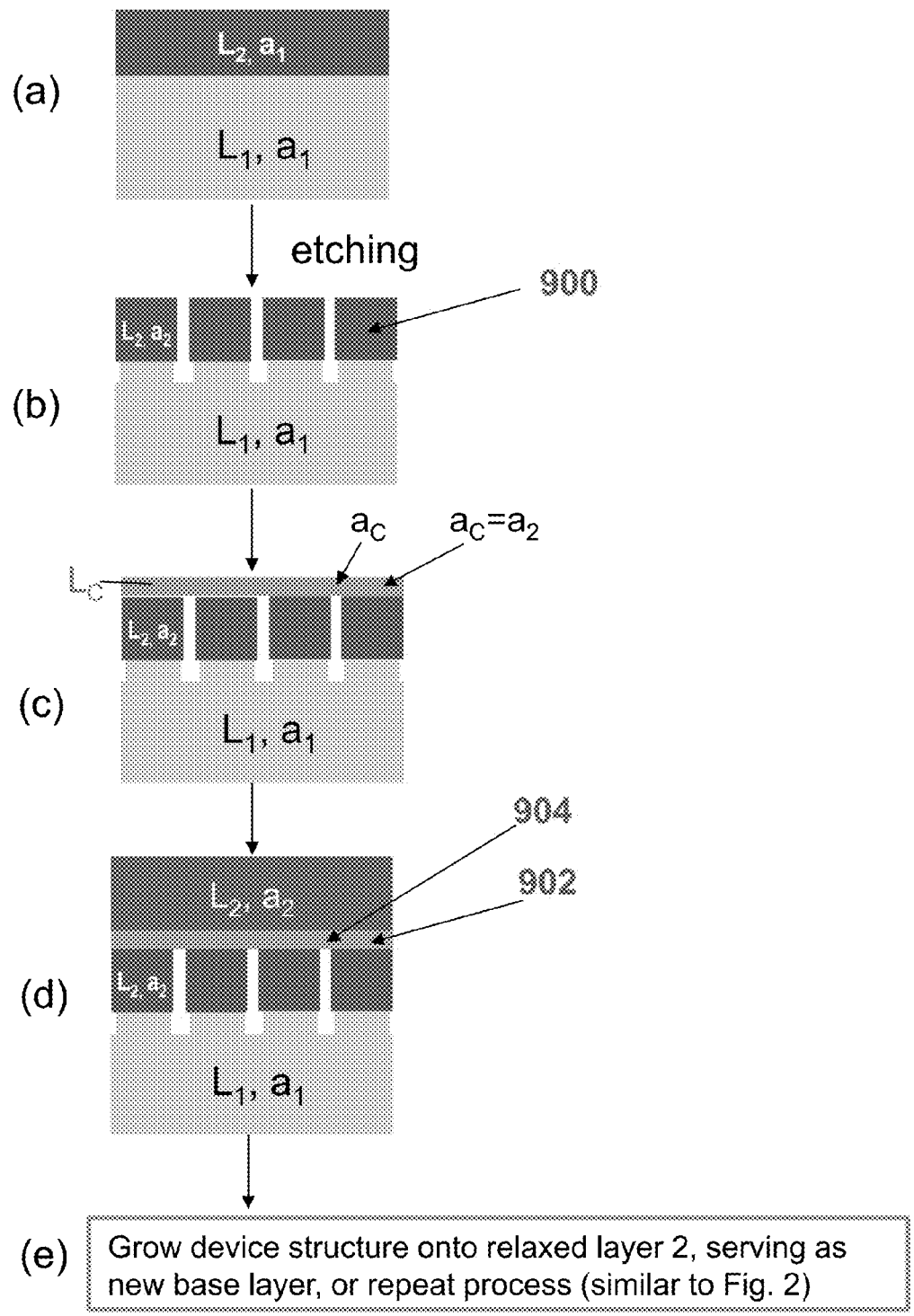
FIG. 9 shows cross-sectional schematics of layer structures, illustrating a modified process with coalescence layer for the case $a_2 > a_1$, comprising (a) depositing layer $L_2$ coherently strained on layer $L_1$, (b) etching $L_2$ into nanofeatures, wherein $L_2$ relaxes after etching into nanofeatures, (c) growing a coalescence layer L having lattice constant $a_c = a_2$ and that is coherently strained on top of the nanofeatures, (d) continuing deposition of $L_2$ on relaxed nanosegments, and (e) growing the device structure onto relaxed layer $L_2$ serving as the new base layer, or repeating the process (similar to FIG. 2).

FIG. 9 illustrates a method comprising (a) growing layer $L_2$ coherently strained on layer $L_1$, (b) etching layer $L_2$ into nanofeatures 900, wherein layer $L_2$ relaxes after the etching into nanofeatures, (c) coalescing the nanopatterns or stripes 900 by growing a material with a different composition than the patterned film $L_2$ or $L_n$, and called a "coalescence layer" Lc, and regrowing $L_2$ on the coalescence layer Lc.

If the lattice constant of the coalescence layer $L_c$ is substantially different to the one of the patterned material $L_2$ or $L_n$ formed in FIG. 9(b), the thickness of the coalescence layer $L_c$ has to be kept very thin (under the critical thickness for relaxation) so that it will grow coherent (as a strained layer) and maintain the lattice constant of the patterned material 900.

If the lattice constant of the coalescence layer Lc is close to that of the patterned material $L_2$ or $L_n$ formed in FIG. 9(b), the coalescence layer $L_c$ can be thicker (again under the critical thickness for relaxation) and will adopt the lattice constant of the material $L_2$ or $L_n$ grown in FIG. 9(d) on top 902 of the patterns/patterned material 900, and its natural lattice constant in the area overgrowing the gaps 904 of the patterned material 900.

Example 20

To ease the coalescence process, the re-growth on the patterned (In,Ga)N layer $L_2$ or $L_n$ can be initiated by raising the temperature above the temperature used to grow the InGaN or InGaN MQW (layer $L_2$ or $L_n$) which was etched into patterns. The re-growth can further comprise deposition of a thin GaN coalescence layer at temperatures also higher than that used for InGaN growth of $L_2$ or $L_n$. In one example of a stripe pattern formed in $L_2$ or $L_n$, the thin GaN coalescence layer is under one dimensional (1D) tensile strain on top of the stripes, adopting the a-lattice constant of the stripes. The fabrication process is continued with the deposition of an InGaN layer, which will again adopt the a-lattice constant of the stripes, resulting in 1D relaxation of the InGaN layer, if the composition is matched, or partial relaxation for layers with higher In composition, for example. To achieve two dimensional (2D) relaxation, this InGaN layer can be patterned into stripes again with an angle between 30 and 90 degrees with respect to the first stripe array beneath. Full or partial two dimensional relaxation will result depending on the specific composition of the layer, corresponding to the specific design of the layer structure.

Figure 10:
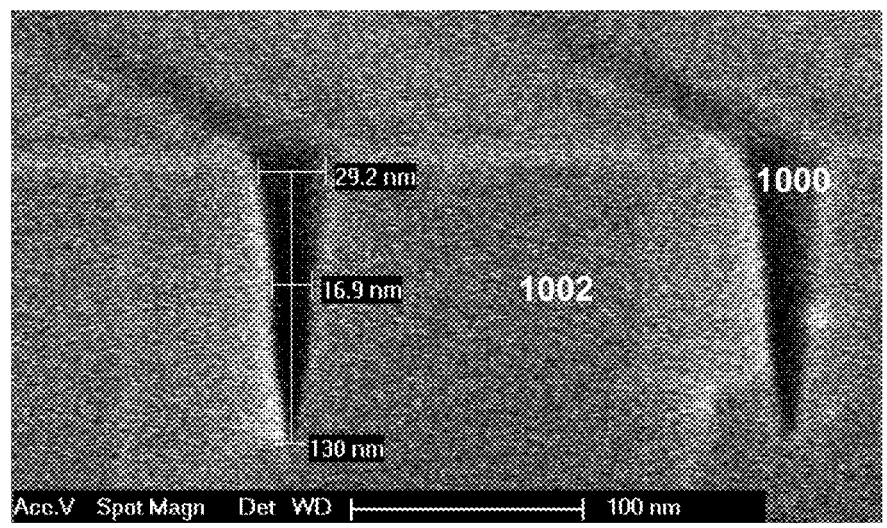
FIG. 10 is a Scanning Electron Microscope (SEM) image showing the existence of narrow gaps between etched patterns in (In,Ga)N.
Figure 10:
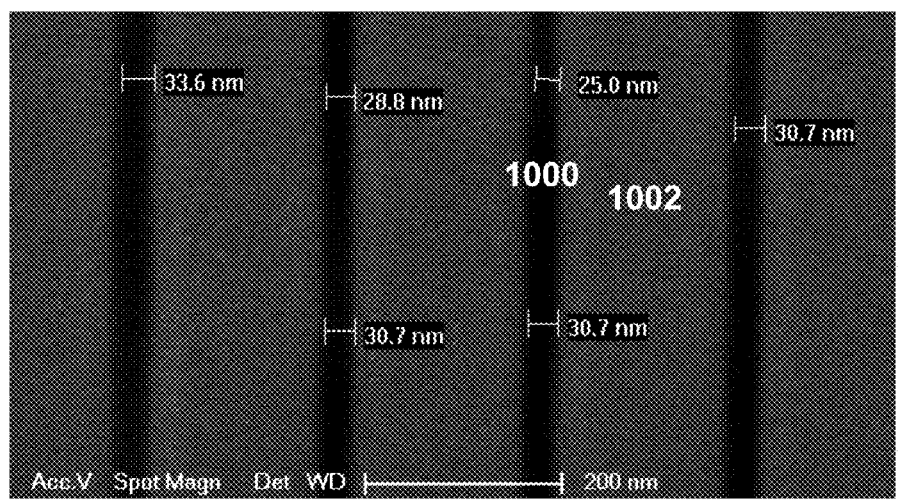

This option requires the existence of narrow gaps 1000 between etched patterns 1002 as illustrated for the stripes in FIG. 10.

Example 21

An attractive patterning scheme to achieve two dimensional relaxation is a rhombohedral lattice, as illustrated in FIG. 11(a)-(b), allowing the use of lines 1100 of a single specific orientation 1102, 1104 in the hexagonal lattice, for example lines 1100 parallel to the {1-100} direction.

Figure 11:
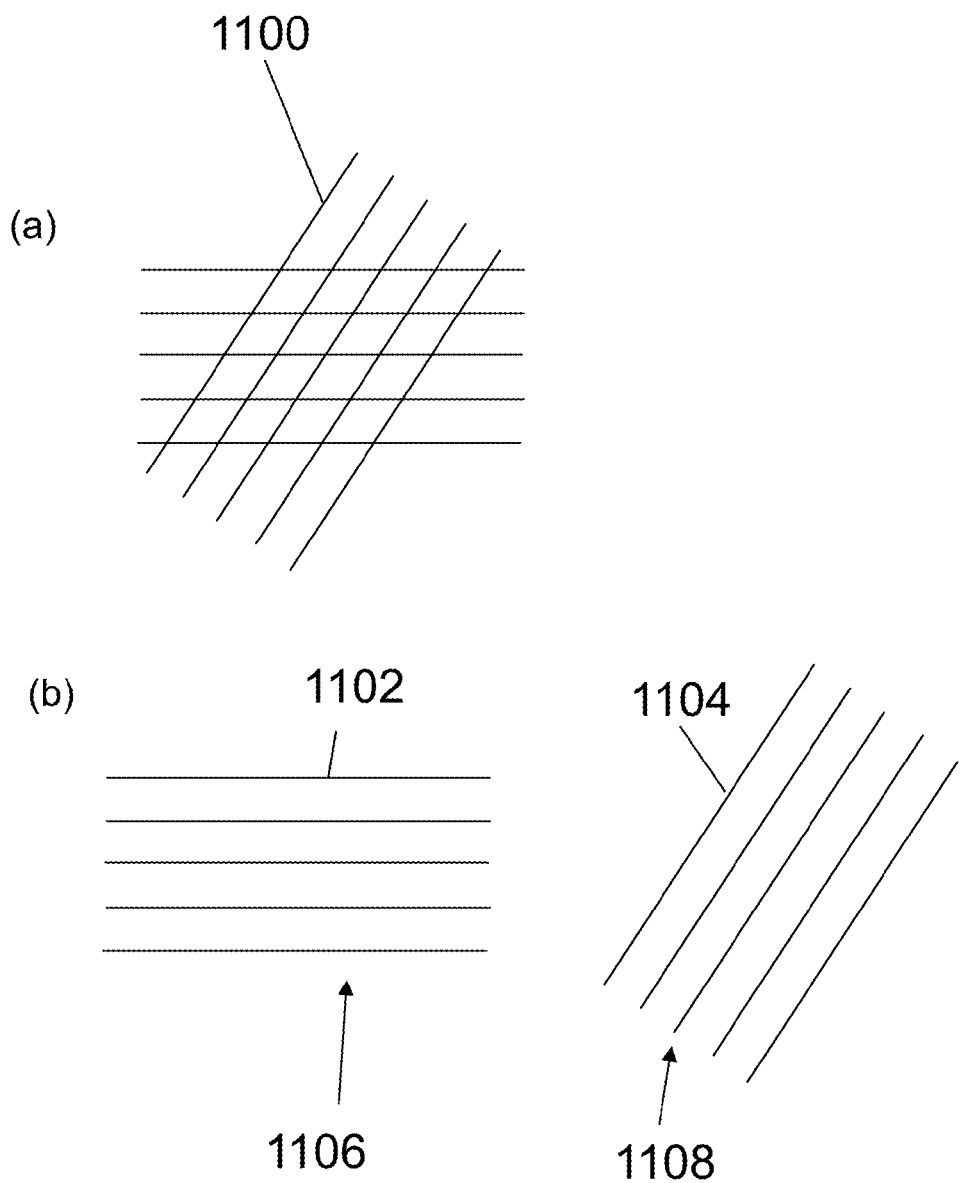
FIG. 11 illustrates a rhombohedral pattern which can be created in one step (a) or by fabricating 2 consecutive stripe patterns offset in an angle.

The rhombohedral pattern can be implemented in one step to achieve two dimensional relaxation immediately, as shown in FIG. 11 (a), or the process can be conducted in two steps using stripe patterns 1106, 1108 as shown in FIG. 11 (b).

Example 22

Figure 12:
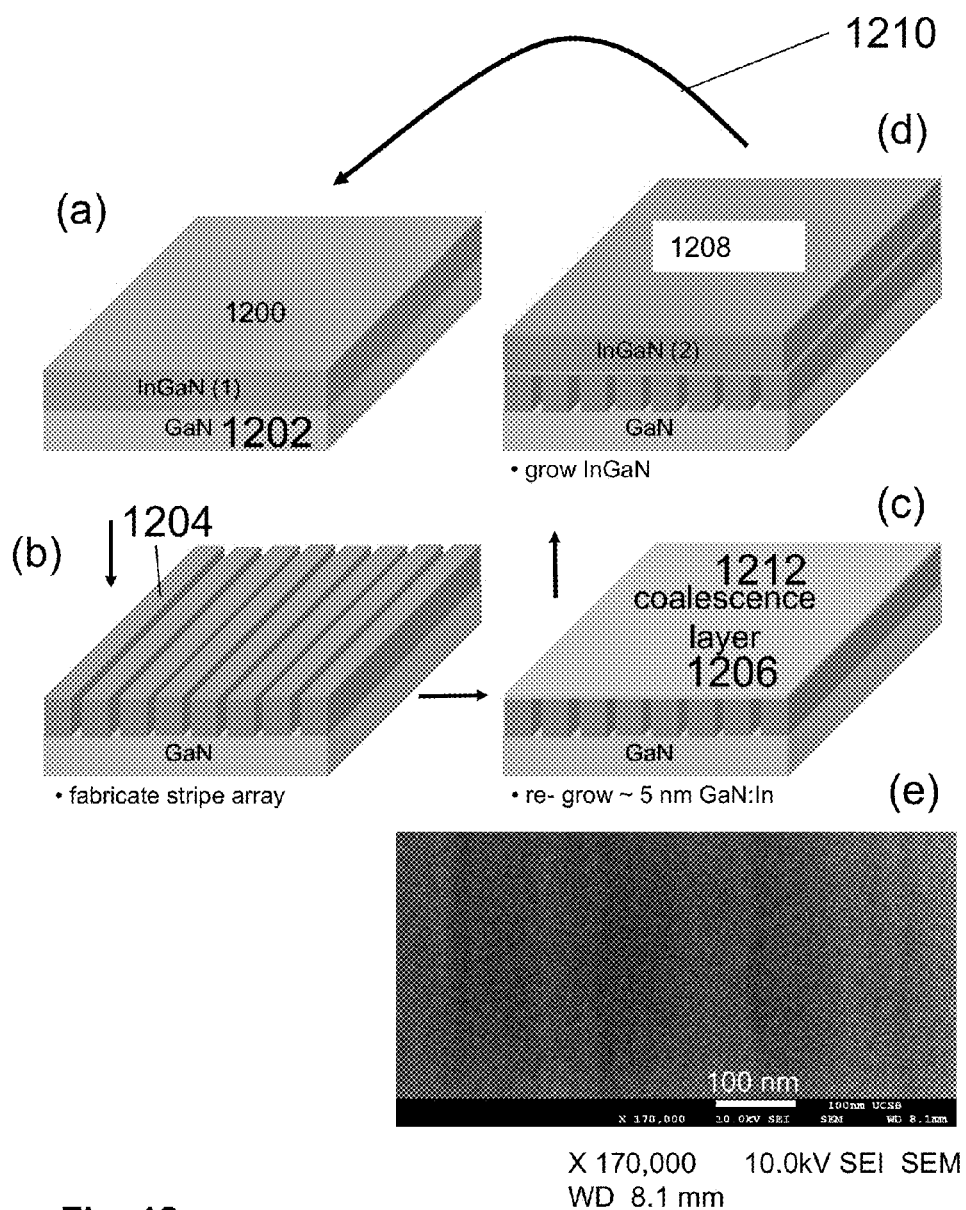
FIG. 12 illustrates a method of obtaining two dimensionally (2D) relaxed or partially relaxed InGaN.

An example of the two step process is illustrated in FIG. 12. The process comprises obtaining/growing a strained InGaN layer 1200 (or InGaN (1)) on GaN 1202, as shown in FIG. 12(a), etching stripes 1204 to fabricate a stripe array into the strained InGaN layer 1200, as shown in FIG. 12(b), then regrowing a ~5 nm thick GaN:In layer 1206 (thereby coalescing with coalescence layer 1206 the stripes 1204 or stripe pattern) as shown in FIG. 12(c), growing a one dimensional relaxed InGaN layer 1208 (or InGaN (2)) on top of the coalescence layer 1206, as shown in FIG. 12(d), followed by repeating 1210 the process. The process is repeated by patterning the one dimensionally relaxed layer (2) or 1208 and etching stripes with an angle of 60 degree to the direction of the first stripe array 1204. After coalescence of the InGaN layer (2) or 1208, the InGaN growth is continued to achieve a two dimensionally relaxed InGaN film. The layers 1208 do not need to be completely relaxed. Partial relaxation is sufficient to achieve a base layer 1208 with an a-lattice constant different from GaN.

FIG. 12(e) is an SEM image of the top surface 1212 of the sample in FIG. 12(c) after growth of 5 nm thick GaN coalescence layer, showing the top surface 1212 of coalescence layer 1206.

Example 23

Figure 13:
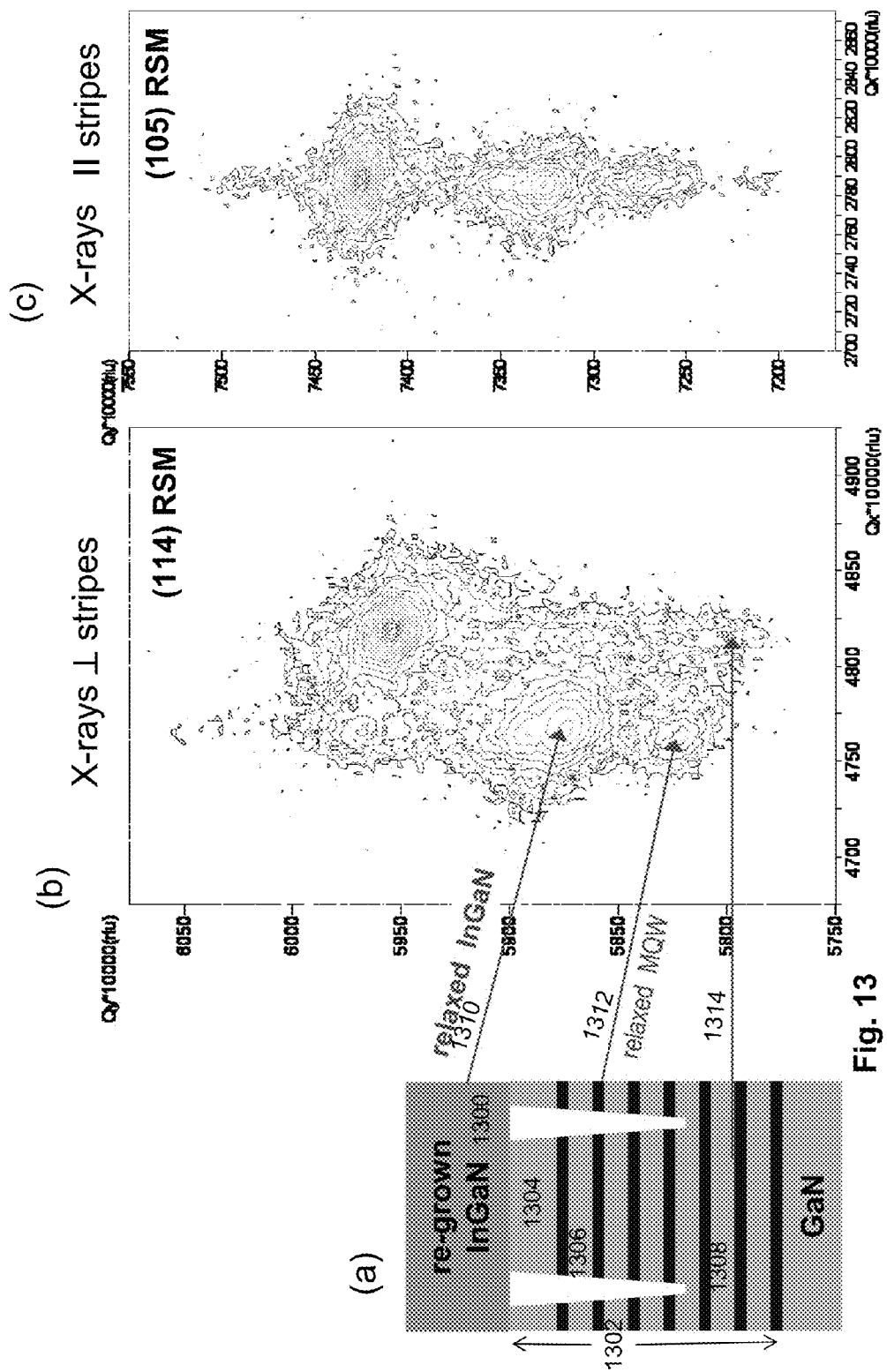
FIG. 13 illustrates a one dimensionally relaxed $In_{0.1}Ga_{0.9}N$ film grown on a stripe-patterned MQW template, as well as Reciprocal Space Mapping (RSM) of the structure.

FIG. 13(a) illustrates a one dimensionally relaxed $In_{0.1}Ga_{0.9}N$ film 1300 re-grown on a MQW stack 1302 comprising a stripe-patterned and relaxed MQW template 1304, as well as Reciprocal Space Mapping (RSM) of the structure, with X-rays perpendicular to the stripes 1306 (FIG. 13(b), (114) RSM) and parallel to the stripes 1306 (FIG. 13(c), (105) RSM). As shown in FIG. 13(a), the etch of the stripes 1306 did not go through the entire MQW stack 1302, resulting in remaining planar QWs 1308 that are still coherently strained. FIG. 13(b) shows RSM peak 1310 corresponding to relaxed InGaN layer 1300, RSM peak 1312 for relaxed MQW 1304, and RSM peak 1314 for QWs 1308.

Table 1 show the RSM parameters used and obtained for FIG. 13(b)

| Omega | 2Theta | Phi | Psi | x | y | z |
|---|---|---|---|---|---|---|
| 10.93540 | 99.99595 | −2.76 | −0.09 | 0.00 | 0.00 | 9.580 |

Table 2 shows the RSM parameters used and obtained for FIG. 13(c)

| Omega | 2Theta | Phi | Psi | x | y | z |
|---|---|---|---|---|---|---|
| 31.89330 | 104.94855 | −91.83 | 0.04 | 0.00 | 0.00 | 9.580 |

Partial relaxation is sufficient in all discussed cases as long as a change in lattice constant compared to GaN is achieved.

Example 24

FIG. 14(a)-(d) illustrate a further process variation. FIG. 14(a) shows as grown layers 1400, 1402 deposited on GaN 1404, FIG. 14(b) shows a first etch (etch 1), FIG. 14(b) shows a second etch (etch 2), and FIG. 14(d) shows continuing growth.

Instead of nanopatterns, larger, up to micron-sized patterns 1406a (comprising features 1406b up to 10 μm wide 1408) are etched into coherently strained alloy layers 1400-1402, as shown in FIG. 14(b), etch 1. In the case of relaxed InGaN films, when depositing first the strained alloy films 1400-1402 on top of a GaN base layer 1404, the growth is initiated with a thin $In_xGa_{1-x}N$ layer 1400 prior to the deposition of the main thick $In_yGa_{1-y}N$ layer 1402. Thereby x has to be larger than y. The two layer 1400-1402 stack is then etched into pattern(s) 1406a of features 1406b (etch 1) with similar shapes as described previously, for example into a rhombohedral pattern. The features 1406b can have a nano-scale or microscale width/diameter/cross-section 1408.

Afterwards, as shown in FIG. 14(c), a second etch step etch 2 is introduced to selectively etch the thin $In_xGa_{1-x}N$ layer 1400 only, undercutting the thick $In_yGa_{1-y}N$ layer 1402, in such a way that only a post 1410 remains in the center of the, e.g., rhombohedral features. The second etch (etch 2) is performed using photo-electrochemical etching or any other suitable etching method to achieve an undercut 1412. Since the thick $In_yGa_{1-y}N$ layer 1402 is now detached from the GaN base layer 1404, it can relax and adopt its unstrained lattice constant. If the $In_xGa_{1-x}N$ post 1410 diameter is comparable or smaller than the thickness of the $In_yGa_{1-y}N$ layer 1402, relaxation will occur above the post 1410 as well.

As in the previously described process flow, the crystal growth process is now continued, merging the etched features followed by the deposition of $In_zGa_{1-z}N$ 1414, leading to a relaxed (z=y) or partially relaxed (z≠y) $In_zGa_{1-z}N$ film with an a lattice constant corresponding to the patterned relaxed $In_yGa_{1-y}N$ features 1406b.

Example 25

As described previously in Example 24, instead of creating two dimensional features such as rhombohedral pillars, for example, in one step, the process can be broken up into two consecutive one dimensional patterning steps. The two steps can include etching stripes first in one direction, and then etching a second set of stripes at an angle (e.g., 60 degrees) with respect to the first stripe array, to create a rhomobohedral lattice. In this procedure, stripes are first etched, followed by achieving the undercut in a second etch step. The stripes are then merged and the InGaN growth continued. Then, a thin $In_sGa_{1-s}N$ layer has to be again deposited beneath a thicker $In_tGa_{1-t}N$ layer with s>t, and both layers have to be coherently strained. The sample is then taken out of the reactor again, and a second array of stripes is etched, with an angle to the first stripe array, all the way through the 2 topmost layers.

In the rhombohedral approach, the angle would be 60 degrees for example. The entire process is then repeated going through photo-electrochemical etching, coalescence of the stripes, and continued growth of the $In_zGa_{1-z}N$, the $In_zGa_{1-z}N$ now being fully relaxed for y=t=z or partially relaxed in the presence of small differences between y, t, and z.

Example 26

FIG. 15(a)-(d) illustrate a further process variation, comprising depositing mask material 1500 on GaN 1502 and etching openings 1504, as shown in FIG. 15(a), selectively growing InGaN layers 1506, 1508, as shown in FIG. 15(b), performing a second etch (etch 2), as shown in FIG. 15(c), and continuing growth, as shown in FIG. 15(d).

In one embodiment of Example 26, relaxed or partially relaxed films can also be fabricated by selectively growing a thin $In_xGa_{1-x}N$ layer 1506, followed by a thicker $In_yGa_{1-y}N$ layer 1508, into nano- to micron sized openings 1504 in an GaN base layer, creating, for example, (In,Ga)N discs/features 1510. The openings 1504 and features 1510 and can have nano-micron sized width 1512, 1514 or diameter.

After removal of the mask material 1500, photo-electrochemical etching, for example, is used to laterally etch the $In_xGa_{1-x}N$ 1506, thereby undercutting the $In_yGa_{1-y}N$ 1508 as described above, leaving a nanometer sized post behind 1516. Afterwards, the features 1510 can be again coalesced and a subsequently grown InGaN layer 1518 will have the same a lattice constant as the relaxed $In_yGa_{1-y}N$ layer 1506.

Example 27

Instead of coalescing in Example 26, growth can be executed on top of the discs.

Example 28

In Examples 24-27, the bulk InGaN films can be replaced by multi quantum well stacks. The well composition has to follow the same rules as for the bulk InGaN layers.

Example 29

In Examples 24-27, growth can be continued after the second etch (etch 2) without coalescence to fabricate individual devices.

Example 30

Two dimensional features such as rhombohedral pillars can be formed using Examples 24-29 in one step, or the process can be broken up into two consecutive one dimensional patterning steps by etching features 1406b that are stripes. The stripes are first etched in one direction and a second set of stripes is etched at an angle to the first stripe array, for example the angle of 60 degrees, to create a rhombohedral lattice. In this procedure, stripes 1406b are first etched, as shown in FIG. 14(b), followed by achieving the undercut 1412 in a second etch step, as shown in FIG. 14(c). The stripes are then merged and InGaN growth continued to form $In_zGa_{1-z}N$ 1414, as shown in FIG. 14(d). The process of FIG. 14(a)-(d) is then repeated, wherein, on top of layer 1414, a thin $In_sGa_{1-s}N$ layer 1400 has to be again deposited beneath a thicker $In_tGa_{1-t}N$ layer 1402 with s>t and both layers have to be coherently strained, as illustrated in FIG. 14(a). The sample is then taken out of the reactor again, and a second array of stripes is etched with an angle to the first stripe array all the way through the 2 topmost layers, as shown in FIG. 14(b). Using the rhombohedral approach, the angle would be 60 deg, for example. Then, the method performs photo-electrochemical etching or etch 2 according to FIG. 14(c), coalescence of the stripes, and continued growth of a new $In_zGa_{1-z}N$ layer now being fully relaxed for y=t=z or partially relaxed in the presence of small differences between y, t, and z, as shown in FIG. 14(d).

Example 31

FIG. 16(a)-(f) illustrate a process flow to achieve 2 dimensional relaxation (or partial relaxation) using consecutive stripe pattern formation can be simplified in the following way.

Figure 16:
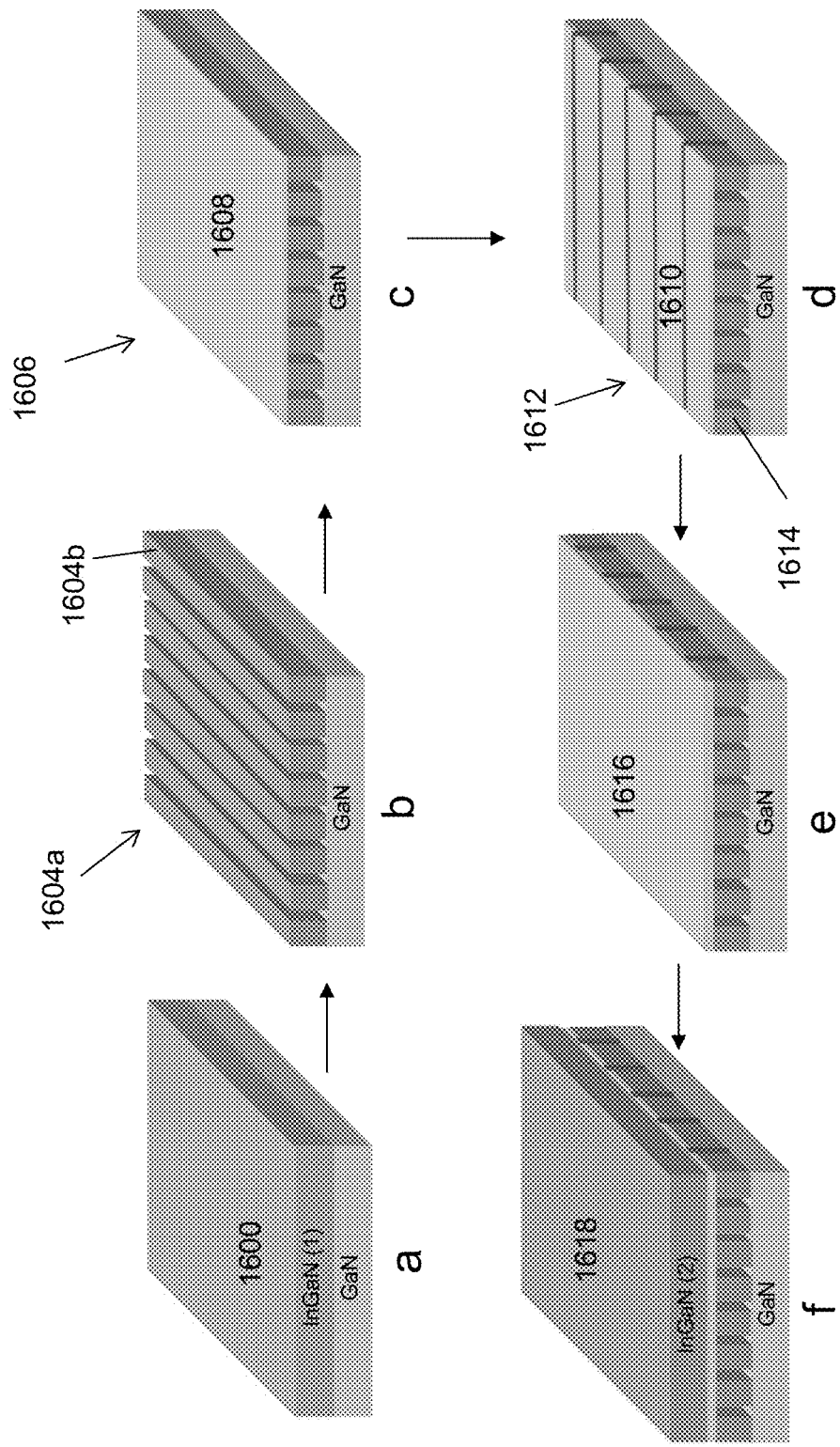
FIG. 16 is a schematic of a process flow according to another embodiment.

FIG. 16(a) illustrates growing or obtaining a first (In,Ga)N layer 1600 on GaN layer 1602. The layer 1600 could also comprise an InGaN/GaN MQW stack. After stripe patterning 1604a of the first (In,Ga)N layer 1600 or InGaN/GaN MQW stack with stripes 1604b, as shown in FIG. 16(b), the sample 1606 is loaded back into the MOCVD system to coalesce the stripes 1604b with a very thin GaN layer 1608 (less than 20 nm thick), as shown in FIG. 16 (c). Afterwards, the sample 1606 is removed from the MOCVD reactor and stripes 1610 are patterned in the orthogonal direction, or any other angle larger than 30 degrees, compared to the direction of the first stripe pattern 1604a, as shown in FIG. 16 (d), thereby forming a stripe pattern 1612 in both the GaN layer 1608 and the InGaN 1600 and leading to a two dimensional pattern in the InGaN layer (1) 1600 underneath, allowing two dimensional relaxation of the formed InGaN posts 1614. The sample is then re-inserted into the MOCVD reactor, the surface stripes 1610 are again coalesced using a thin GaN layer 1616, as shown in FIG. 16 (e), followed by the deposition of another InGaN layer (2) 1618, which adopts the lattice constant of the relaxed InGaN posts 1614, as shown in FIG. 16 (*f*). The thin GaN coalescence layer(s) 1608 1616 are strained with respect to the patterned InGaN 1600 underneath.

Example 32

Example Growth Procedure for Pseudo-Substrate

On top of a GaN:Si-on-sapphire layer, first a 25 period superlattice (SL), e.g., 1600, comprised of 3 nm thick $In_{0.2}Ga_{0.8}N$ wells and 5 nm thick GaN barrier layers is deposited as described in [13]. The sample is removed from the reactor and stripes (e.g., 1604*b*) with a period of ~200 nm are etched. Afterwards the sample is returned into the MOCVD reactor and a ~12 nm thick GaN coalescence layer (e.g., 1608) is deposited at 1080° C. The sample is removed from the reactor and the now planar sample is processed into stripes (e.g., 1610) with an angle of 60° compared to the first set of stripes. The sample is returned again back into the MOCVD reactor and another ~12 nm thick GaN coalescence layer (e.g., 1616) is grown at 1080° C., followed by 200 nm of $In_{0.15}Ga_{0.85}N$ at 840° C. (e.g., 1618), which is now partially relaxed with an a lattice constant corresponding to the average composition of the 25 period SL.

Process Steps

Figure 17:
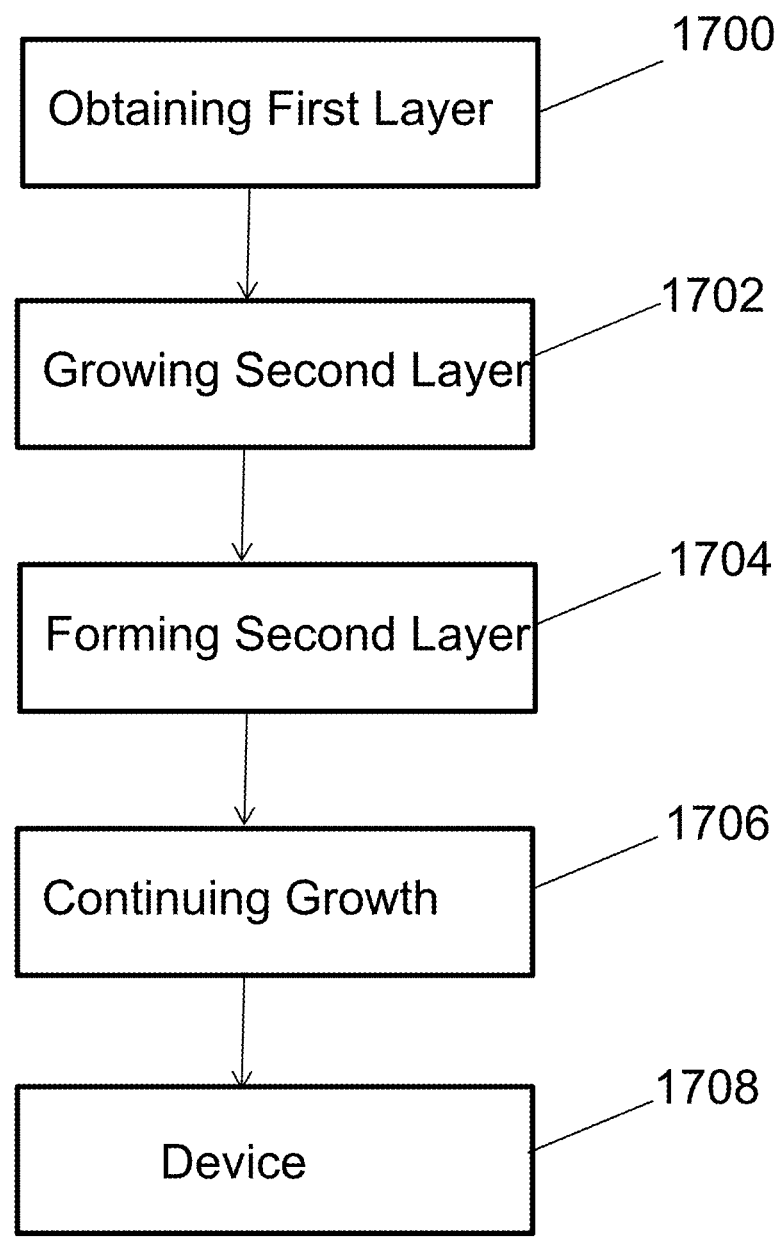
FIGS. 17-23 are flowcharts illustrating methods according to one or more embodiments.

FIG. 17 illustrates a method of fabricating a heterostructure device, comprising the following steps.

Block 1700 represents obtaining a first layer or substrate (e.g., c-plane GaN).

Block 1702 represents growing a second layer on the first layer or substrate. The step can comprise growing the second layer as a coherently strained second layer, within critical thickness limits for the second layer.

Block 1704 represents forming the second layer that is at least partially relaxed (e.g., 1D or 2D partial or full relaxation). The forming can comprise, for example, etching stripes in the second layer and then continuing growth 1706 of the second layer.

The steps of Blocks 1700-1704 can be repeated using the second layer fabricated in Block 1704 as the first layer in Block 1700. The repeating can include changing an orientation of the stripes of the layers in the subsequently deposited heterojunctions to obtain 2-dimensional relaxation. The repeating can include gradually increasing or decreasing the lattice constants of the layers in the subsequently deposited heterojunctions.

Block 1708 represents the end result, a device or device structure. The device comprises a heterojunction comprising the first layer and the second layer deposited on the first layer, wherein (1) the first layer and the second layer are at least partially relaxed crystal layers, (2) the first layer and the second layer have the same lattice structure but different lattice constants, and (3) the heterojunction forms an active area of the device or serves as a pseudo-substrate for the device.

The second layer can comprise segments (e.g., nano-segments having nano scale width) or stripes (e.g., nanostripes having nanoscale width) and a portion above the segments or stripes bridging tops of the nano-segments or stripes.

The device can comprise a green, yellow, or red GaN based light emitting diode (LED), a laser diode (LD) structure, or a solar cell, for example.

The first and second layers of the device structure can comprise III-nitride crystal layers, e.g., the first layer comprising GaN and the second layer comprising a nitride containing Indium, Gallium, or Indium and Gallium (e.g., InGaN).

The first layer can be GaN and the second layer can be a nitride containing Aluminum, Gallium, or Aluminum and Gallium (e.g., AlGaN).

In an embodiment where the steps are repeated, the device can comprise an additional heterojunction comprising a third layer deposited on the second layer, wherein: (4) the third layer and the second layer are at least partially relaxed crystal layers, (5) the third layer and the second layer have the same lattice structure but different lattice constants, (6) the additional heterojunction forms an active area of the device or serves as a pseudo-substrate for the device, and (7) the lattice constants of the layers in the additional heterojunction are gradually increased or decreased as compared to the lattice constants of the layers in the first heterojunction.

In an embodiment where steps are repeated, the device can comprise a stack comprising a plurality of the heterojunctions deposited one on top of another, wherein the individual layers of the next one of the heterojunctions have gradually increased or decreased lattice constants, as compared to a previous one of the heterojunctions immediately below the next one of the heterojunctions.

In an embodiment where steps are repeated, the device can comprise a plurality of the heterojunctions that are successively deposited one on top of another, wherein: the first layer of the next heterojunction is the second layer of the immediately underlying heterojunction upon which the next heterojunction is deposited; the lattice constants of the layers in the next heterojunction are gradually increased or decreased as compared to the lattice constants of the layers in the immediately underlying heterojunction.

In an embodiment where steps are repeated, the method can comprise repeating the steps using the re-grown or coalesced second layer as the first layer in and gradually decreasing or stepping down the lattice constants of the layers in the subsequently deposited heterojunctions (e.g., when the second layer is AlGaN) or comprises Aluminum and/or Gallium.

Embodiments of the method illustrated in FIG. 17 are at least shown in FIG. 1, FIG. 2, FIG. 7, FIG. 8, FIG. 9, FIG. 12, FIG. 14, FIG. 15, FIG. 16, FIGS. 18-23, and FIGS. 26-27.

Etching Embodiments

Figure 7:
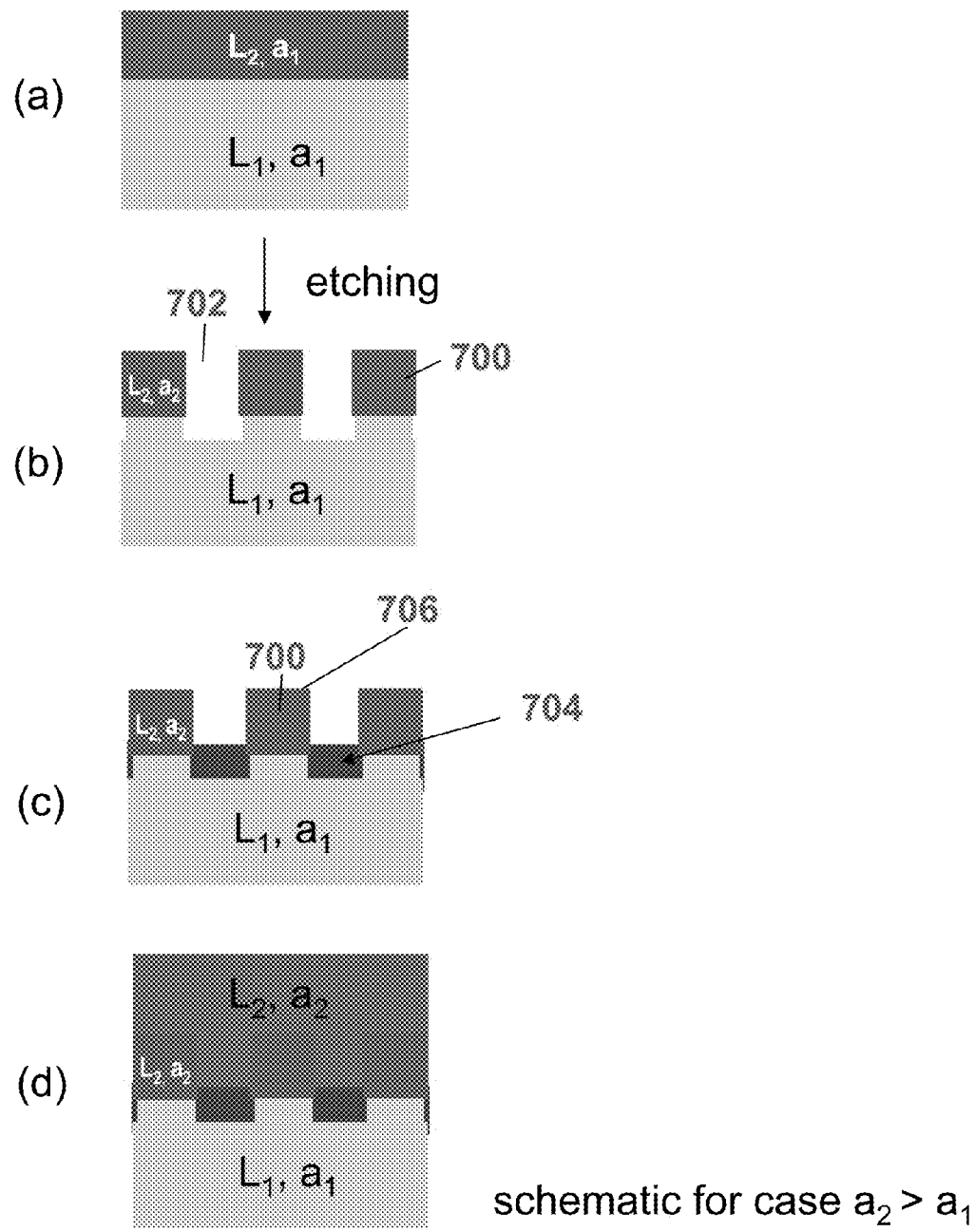
Figure 8:
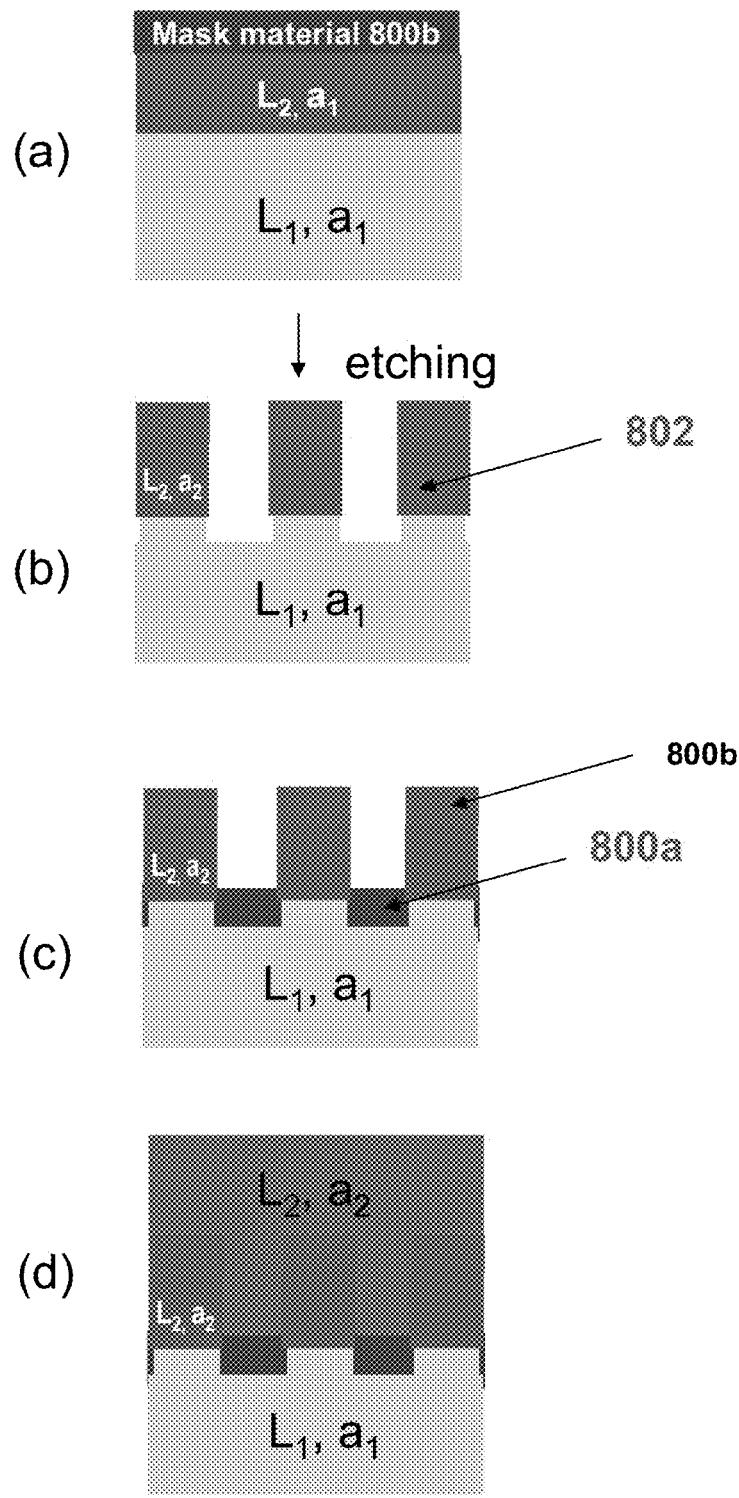
Figure 18:
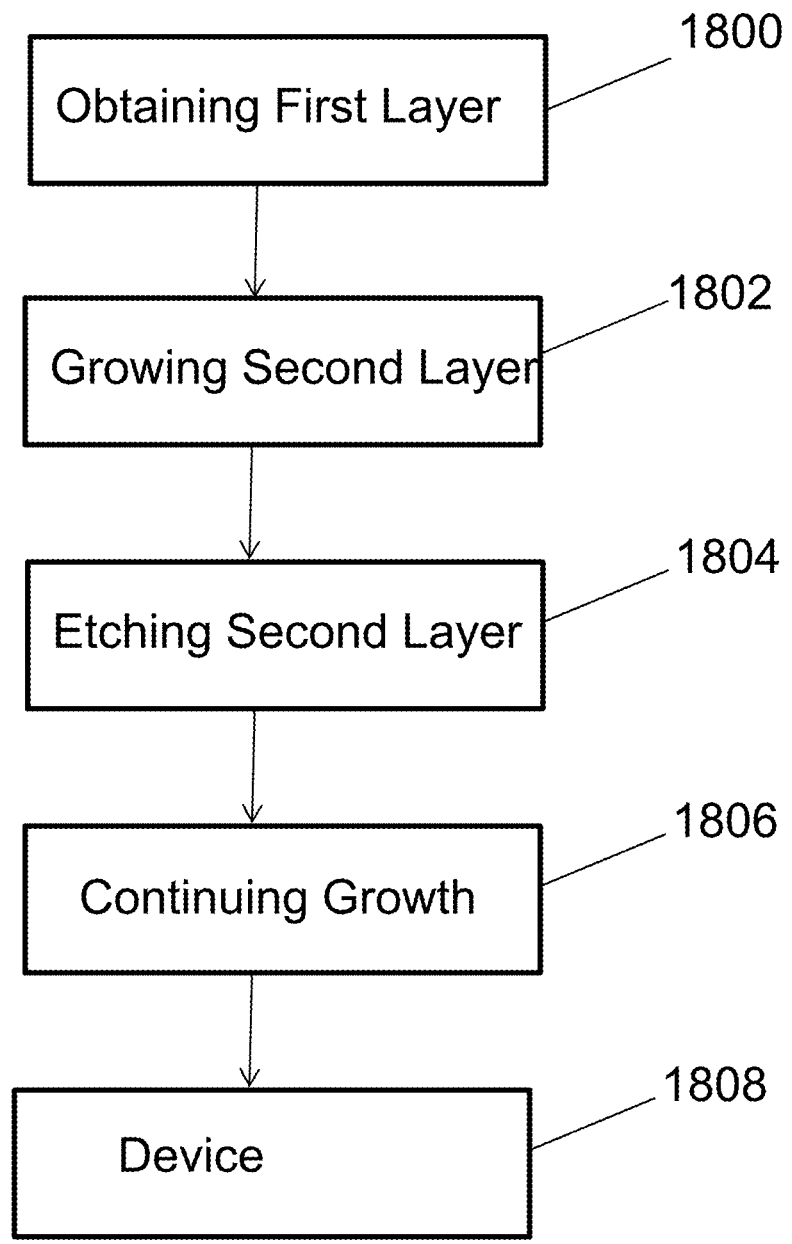

FIG. 18 illustrates a method of fabricating a heterostructure device, comprising the following steps (referring also to FIG. 1, FIG. 7, and FIG. 8).

Block 1800 represents obtaining a first layer, e.g., $L_1$.

Block 1802 regrowing a coherently strained second layer, e.g., $L_2$, within critical thickness limits for the second layer, on the first layer, e.g., as shown in FIG. 1(*a*).

Block 1804 represents etching the coherently strained second layer (e.g., $L_2$) into stripes or segments 100, e.g., nanosegments or nano-stripes, resulting in at least partial relaxation of the coherently strained second layer into at least partially relaxed segments or stripes of the second layer, e.g., as shown in FIG. 1(*b*). The second layer can be etched into a stripe pattern. The pattern can produce one or two dimensional full or partial relaxation of the second layer. The pattern can have a rhombohedral lattice. The stripes and/or segments can have nanoscale or microscale width/cross-section, e.g., up to 1000 nanometer or up to 1000 micrometer (μm) width/diameter/cross-section/size.

The step can deposit a mask material 800*b* in order to etch the segments.

Block 1806 represents continuing growth of, re-growing, or merging the second layer (e.g., $L_2$ in FIG. 1(*c*)), wherein the segments 100 or stripes are merged or coalesced, and wherein (1) the first layer and the second layer have the same lattice structure but different lattice constants, (2) the first layer and the second layer form a heterojunction, and (3) the heterojunction forms an active area of a device or serves as a pseudo-substrate for the device.

The step can comprise depositing mask material, e.g., 704, 800*a-b*, at a bottom and/or at a bottom and on a top of the segments 704 or stripes to promote coalescence of the segments or stripes, as shown in FIGS. 7 and 8.

The re-grown second layer can be fully or partially relaxed.

In an embodiment where mask material is deposited, after merging of the segments or the stripes, the continuing growth of the second layer can overgrow the masked areas 800*a-b* masked by the mask material, thereby forming a continuous at least partially relaxed second layer $L_2$, as shown in FIG. 8(*d*).

In an embodiment where mask material is deposited, after merging of the segments or the stripes, the growth can be interrupted, the mask material 800*b* on the top of the segments or the stripes can be removed, and the growth of the second layer $L_2$ can be continued afterwards.

The steps of Blocks 1800-1806 can be repeated using the second layer fabricated in Block 1806 as the first layer in Block 1800, e.g., as illustrated in FIG. 2. For example, the repeating can include changing an orientation of the stripes of the layers in the subsequently deposited heterojunctions to obtain 2-dimensional relaxation. The repeating can include gradually increasing or decreasing the lattice constants of the layers in the subsequently deposited heterojunctions.

Block 1808 represents the end result, a device structure. The first layer can be GaN and the second layer can be a nitride containing Indium, Gallium, or Indium and Gallium (e.g., InGaN, or an InGaN multi quantum well). The second layer can comprise an electronic or optoelectronic device structure or be used as a base layer for an electronic or optoelectronic device structure.

The crystal layers can be fully or partially relaxed.

Etching and Coalescence Layer Embodiments

Figure 19:
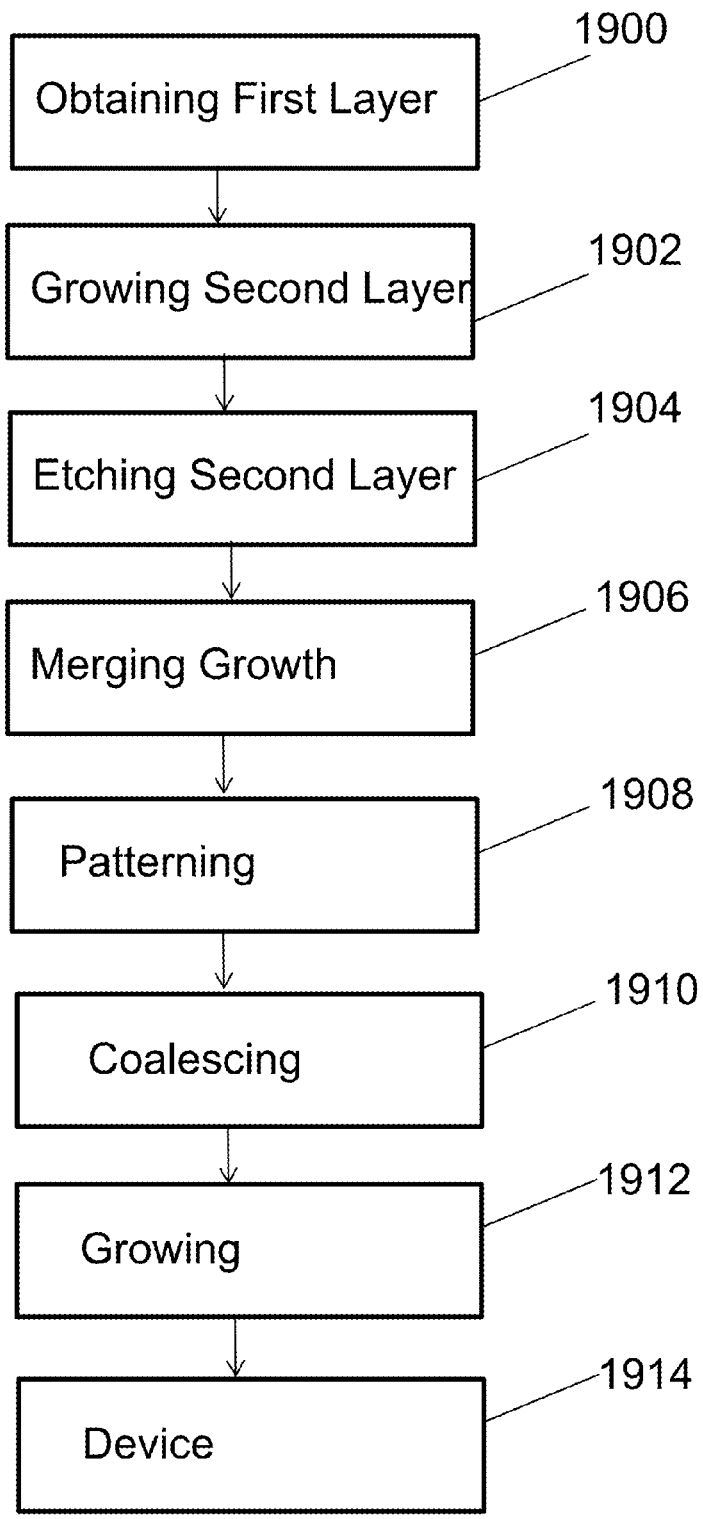

FIG. 19 illustrates a method of fabricating a heterostructure device, comprising the following steps (referring also to FIG. 9, FIG. 12, and FIG. 16).

Block 1900 represents obtaining a first layer, e.g., $L_1$.

Block 1902 represents growing a coherently strained second layer, e.g., $L_2$, within critical thickness limits for the second layer, on the first layer.

Block 1904 represents etching the coherently strained second layer into segments or stripes (e.g., nanosegments 900) and/or a pattern, e.g., nano-pattern, resulting in at least partial relaxation of the coherently strained second layer into at least partially relaxed segments or stripes of the second layer. The stripes and/or segments can have nanoscale or microscale width/cross-section, for example, e.g., up to 1000 nanometer or up to 1000 micrometer width/diameter/cross-section/size.

Block 1906 represents merging the segments or stripes by growing a coalescence layer, e.g., Lc. The step can comprise continuing growth of, re-growing, or merging the second layer, wherein the segments or stripes are merged or coalesced, and wherein (1) the first layer and the second layer have the same lattice structure but different lattice constants, (2) the first layer and the second layer form a heterojunction, and (3) the heterojunction forms an active area of a device or serves as a pseudo-substrate for the device.

The patterns or stripes can be coalesced with a coherently strained coalescence layer and the re-growing/coalescing can be initiated by raising a temperature above a temperature used to grow the coherently strained coalescence layer prior to continuing the growth of the second layer.

The re-growing can comprise (i) growing a GaN coalescence layer (e.g., 1206 in FIG. 12) under one dimensional (1D) tensile strain on top of the stripe pattern, adopting an a-lattice constant of the stripes (e.g, 1204) in the stripe pattern, and (ii) growing an InGaN layer e.g., 1208, on the GaN coalescence layer, wherein the InGaN layer adopts the a-lattice constant of the stripes and results in 1D relaxation of the InGaN layer. The step can comprise patterning the InGaN layer e.g., 1208, into stripes, e.g. 1206 with an angle between 30 and 90 degrees with respect to the stripes 1206 in the second layer 1200, resulting in full or partial two dimensional relaxation of the InGaN layer 1208, e.g., as illustrated in FIG. 12.

The coalescence layer can comprise a material with a different composition than the coherently strained second layer. The material can be fully or partially relaxed. A thickness of the material can be under a critical thickness for relaxation of the material. A thickness of the coalescence layer can increase as the lattice constant of the material is closer to that of the second layer. A lattice constant of the material can adopt a lattice constant of the second layer on top of the segments or stripes, and the lattice constant can adopt a natural lattice constant of the material in an area overgrowing gaps in the second layer.

The method can further include the optional steps of patterning 1908 the coalescence layer and the second layer into a pattern of second stripes, e.g., 1610, with an angle between 30 and 90 degrees with respect to the first stripes in the second layer, resulting in formation of posts, e.g., 1614 in the second layer and full or partial two dimensional relaxation of the second layer, e.g., 1600, as illustrated in FIG. 16; coalescing 1910 the second stripes with a second coalescence layer (e.g., 1616) having a thickness of 20 nm or less; and then growing 1912 a third layer (e.g., InGaN) on the second coalescence layer, wherein the third layer adopts the lattice constant of the posts. The coalescence layers can comprise a thickness less than 20 nm, of e.g., GaN 1608, 1616.

Block 1914 represents the end result, a device or device structure. For example, the first layer can be GaN and the second layer and third layer can be nitride containing Indium, Gallium, or Indium and Gallium. The second and/or third layers can comprise one or more electronic or optoelectronic device structures and/or be used as a base layer for growth of one or more optoelectronic or electronic device structures.

Pillar Embodiments

Figure 20:
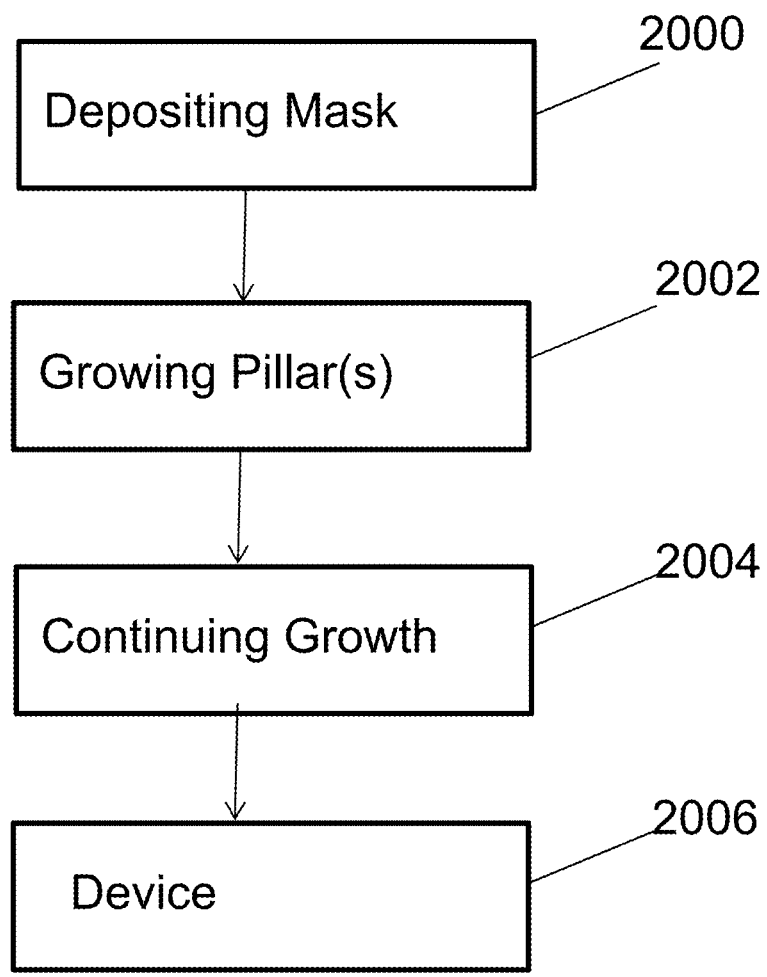

FIG. 20 illustrates a method of fabricating a device, comprising the following steps.

Block 2000 represents depositing a mask material on a Gallium Nitride layer, wherein the mask material includes openings (e.g., nano-sized openings having a nanoscale width/diameter/cross-section).

Block 2002 represents growing a relaxed III-nitride pillar (e.g., nano-pillar) in each of a plurality of the openings, to form a plurality of the III-nitride pillars (e.g., pillars having a nanoscale width/diameter/cross-section), wherein the relaxed III-nitride pillars include Indium and/or Gallium.

Block 2004 represents continuing growth of the III-nitride nanopillars, wherein the III-nitride nanopillars overgrow the openings to form a relaxed III-nitride film including Indium and/or Gallium and (1) the Gallium Nitride layer and the relaxed III-nitride film have a same lattice structure but different lattice constants, (2) the Gallium Nitride film/layer and the relaxed III-nitride layer/film form a heterojunction, and (3) the heterojunction forms an active area of a device or serves as a pseudo-substrate for the device.

Block 2006 represents the end result, a device or device structure. For example, the pillars and/or III-nitride film can be nitride containing Indium, Gallium, or Indium and Gallium and can comprise one or more electronic or optoelectronic device structures. The pillars and/or III-nitride film can be used as a base layer for growth of one or more optoelectronic or electronic device structures.

Figure 21:
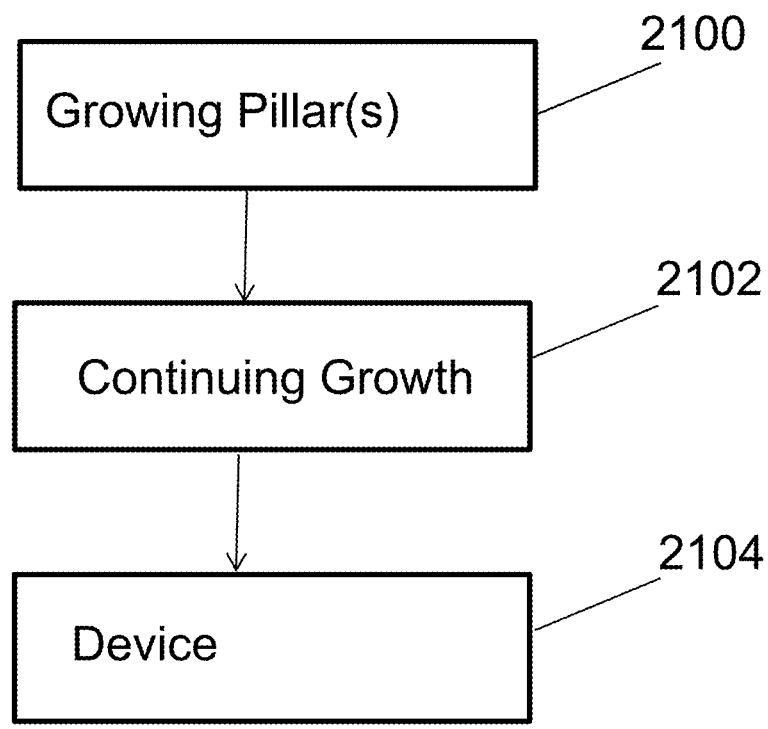

FIG. 21 illustrates a method of fabricating a heterostructure device, comprising the followings steps.

Block 2100 represents growing a plurality of relaxed III-nitride pillars (e.g., nanopillars, pillars having a nanoscale width/diameter/cross-section) on a Gallium Nitride (GaN) layer, wherein the relaxed III-nitride pillars include Indium and/or Gallium, and the relaxed III-nitride pillars are selectively seeded on the GaN layer.

Block 2102 represents continuing growth of the relaxed III-nitride pillars, wherein the relaxed III-nitride pillars are merged, to form a relaxed III-nitride film including Indium and/or Gallium, and wherein (1) the GaN layer and the relaxed III-nitride layer/film have the same lattice structure but different lattice constants, (2) the GaN layer and the relaxed III-nitride layer/film form a heterojunction, and (3) the heterojunction forms an active area of a device or serves as a pseudo-substrate for the device.

In the methods of FIG. 20 and FIG. 21, the III-nitride pillars can comprise (In,Ga)N and/or the relaxed nitride layer can be partially or fully relaxed.

The openings and/or pillars can have nanoscale or microscale width/cross-section, for example, e.g., up to 1000 nanometer or up to 1000 micrometer width/diameter/cross-section/size.

Block 2104 represents the end result, a device or device structure. For example, the pillars and/or III-nitride film can be nitride containing Indium, Gallium, or Indium and Gallium and can comprise one or more electronic or optoelectronic device structures. The pillars and/or III-nitride film can be used as a base layer for growth of one or more optoelectronic or electronic device structures.

Stack Embodiments

Figure 14:
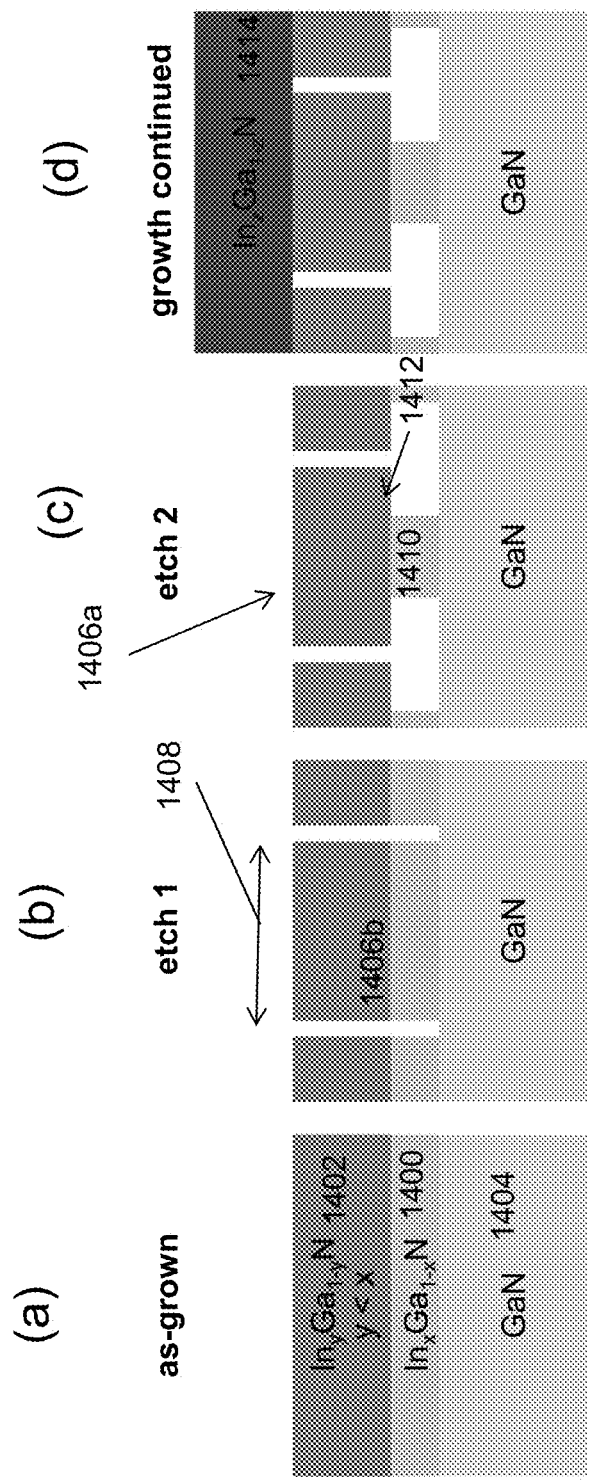
FIG. 14 shows cross-sectional schematics of layer structures, illustrating a schematic process flow for Example 24.
Figure 22:
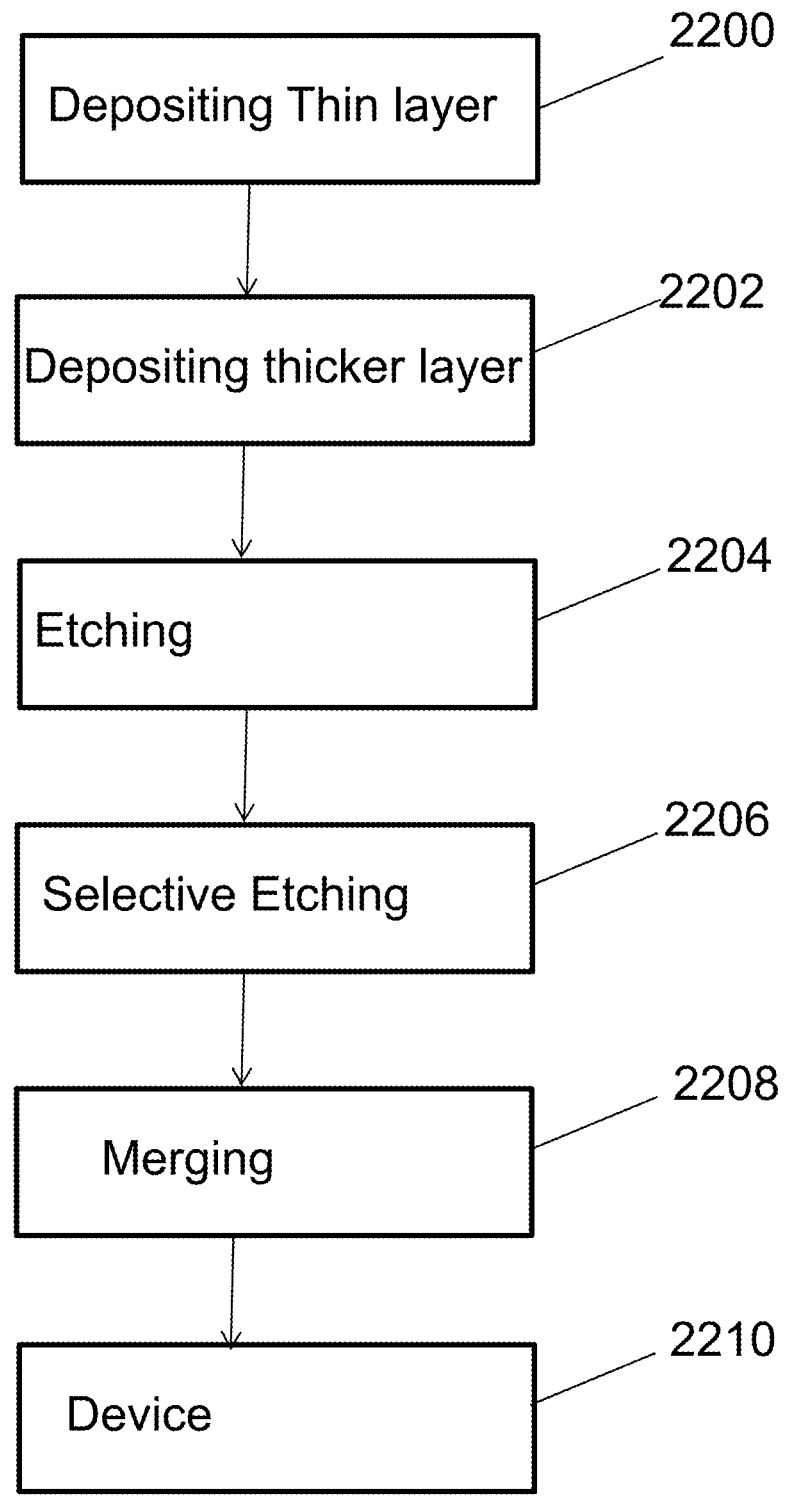

FIG. 22 illustrates a method of fabricating a heterostructure device, comprising the following steps (referring also to FIG. 14).

Block 2200 represents depositing a strained $In_xGa_{1-x}N$ layer (e.g., 1400) on top of a III-nitride or GaN base layer (e.g., 1404).

Block 2202 represents depositing an $In_yGa_{1-y}N$ layer (e.g., 1402) on the $In_xGa_{1-x}N$ layer to form a two layer stack, wherein the $In_yGa_{1-y}N$ layer is thicker than the $In_xGa_{1-x}N$ layer and y<x.

Block 2204 represents etching the two layer stack with a pattern e.g., 1406a, to form etched features (e.g., 1406b, see FIG. 14(b)). The pattern can comprise first stripes oriented in a first direction.

Block 2206 represents selectively etching the thinner $In_xGa_{1-x}N$ layer only, undercutting the thicker $In_yGa_{1-y}N$ layer in such a way that only a post remains (e.g., 1410 in FIG. 14(c)), wherein the thicker $In_yGa_{1-y}N$ layer is detached from the base layer so that it can relax and adopt its unstrained lattice constant.

Block 2208 represents growing an $In_zGa_{1-z}N$ layer (e.g., 1414) on top of the $In_yGa_{1-y}N$ layer.

The etched features can be merged by growth of the $In_zGa_{1-z}N$, leading to a relaxed (z=y) or partially relaxed (z≠y) $In_zGa_{1-z}N$ film with an a lattice constant corresponding to the patterned relaxed $In_yGa_{1-y}N$ features.

The steps 2200-2208 can be repeated, wherein the $In_zGa_{1-z}N$ layer is the base layer for the next step 2200; the strained $In_xGa_{1-x}N$ layer (e.g., 1400) in the next step 2200 is an $In_sGa_{1-s}N$ layer; the thicker $In_yGa_{1-y}N$ layer (e.g., 1402) in the next step 2202 is a $In_tGa_{1-t}N$ layer with s>t such that the $In_sGa_{1-s}N$ layer and the $In_tGa_{1-t}N$ layer form a coherently strained stack; the etching in the next step 2206 is with the pattern e.g., 1406a comprising second stripes oriented in a second direction; the $In_zGa_{1-z}N$ layer, e.g. 1414 in the next growing step 2208 is fully relaxed for y=t=z or partially relaxed in the presence of small differences between y, t, and z; and x, y, z, t are compositions of Indium in the InGaN layers.

An orientation between the first direction and the second direction can produce a rhombohedral lattice in the structure.

Block 2210 represents the end result, a device structure. For example, one or more of the $In_yGa_{1-y}N$ and $In_zGa_{1-z}N$ layers can comprise one or more electronic or optoelectronic device structures. For example, the $In_zGa_{1-z}N$ layer can be used as a base layer for growth of one or more optoelectronic or electronic device structures.

Figure 15:
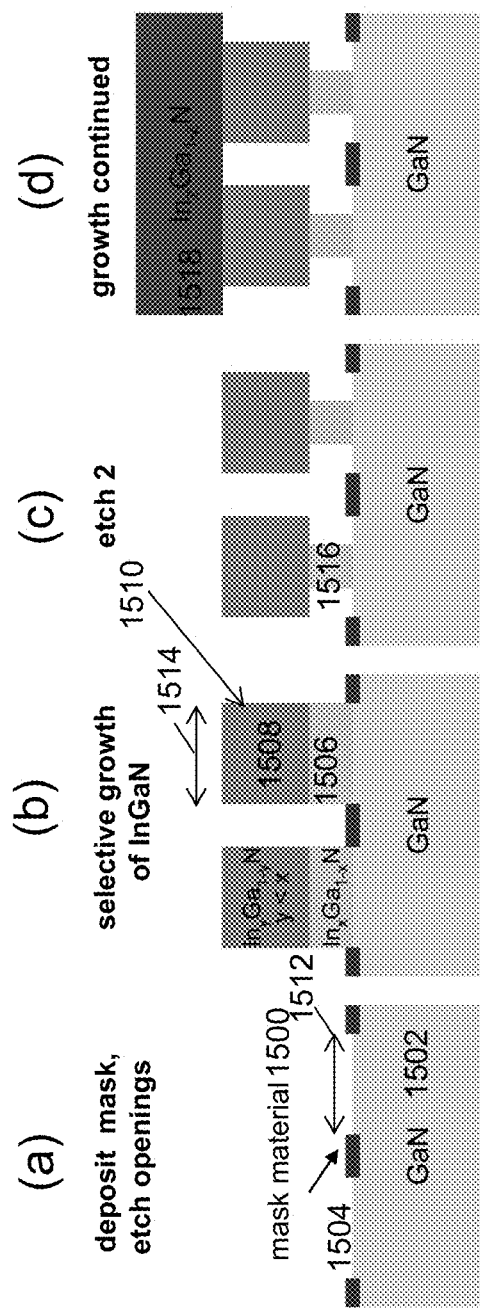
FIG. 15 shows cross-sectional schematics of layer structures, illustrating a schematic process flow for Example 26.
Figure 23:
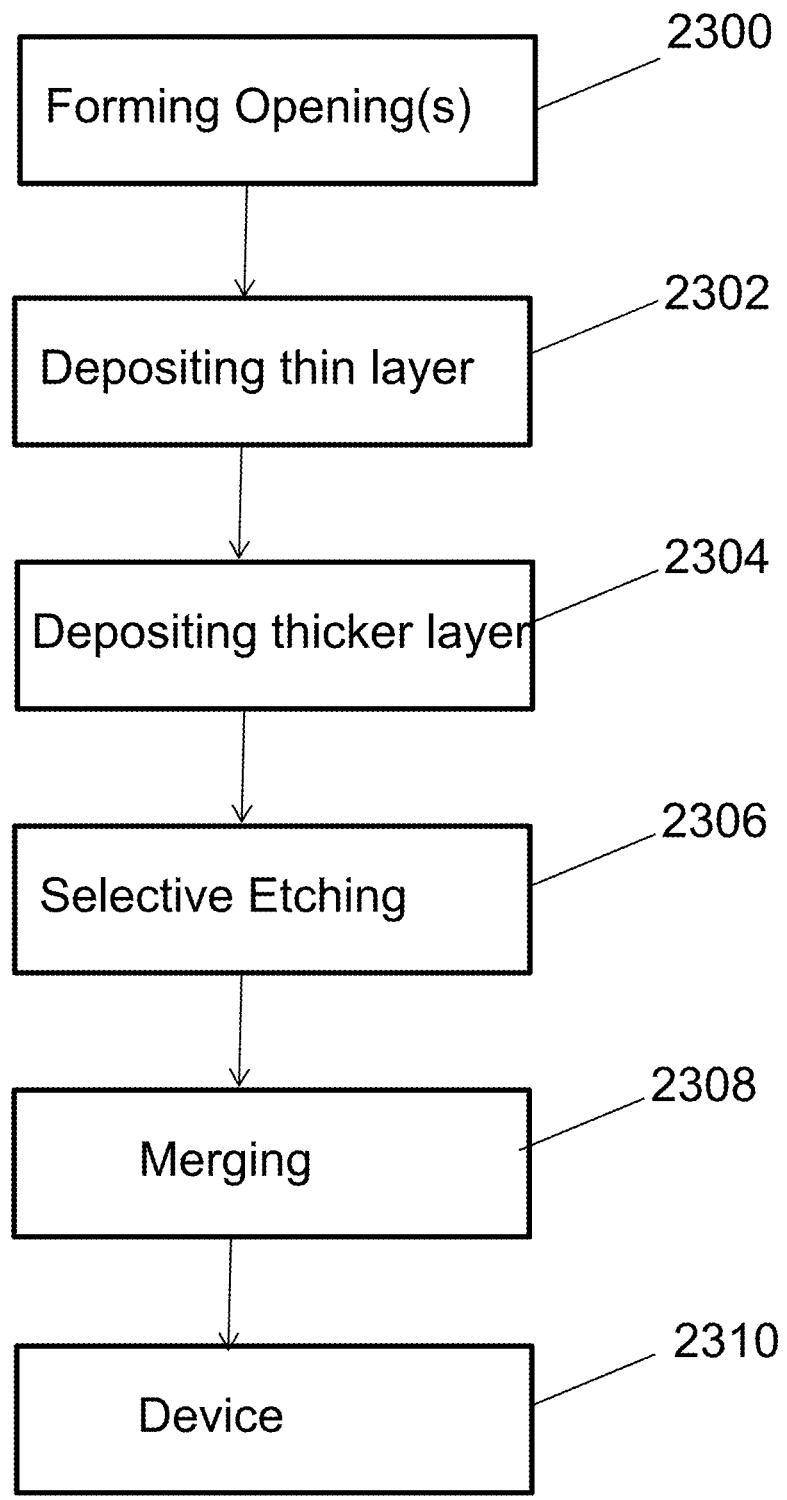

FIG. 23 illustrates a method of fabricating a heterostructure device, comprising the following steps (referring also to FIG. 15).

Block 2300 represents forming (e.g. nano or micron sized/width/diameter/cross-section) openings (e.g., 1504) on a surface of a GaN or III-nitride base layer (e.g., 1502). The openings can have up to 1000 nanometer or up to 1000 micrometer width/diameter/cross-section/size, for example.

Block 2302 represents depositing a strained $In_xGa_{1-x}N$ layer (e.g., 1506) into the openings only.

Block 2304 represents depositing an $In_yGa_{1-y}N$ layer (e.g., 1508) on the $In_xGa_{1-x}N$ layer to form a two layer stack, wherein the $In_yGa_{1-y}N$ layer is thicker than the $In_xGa_{1-x}N$ layer and y<x.

Block 2306 represents selectively etching the thinner $In_xGa_{1-x}N$ layer only, undercutting the thicker $In_yGa_{1-y}N$ layer in such a way that only a post, e.g., 1516 (e.g., nanometer sized or nanometer width post) remains supporting the thicker $In_yGa_{1-y}N$ layer, e.g., as shown in FIG. 15(c).

Block 2308 represents growing an $In_zGa_{1-z}N$ layer, e.g., 1518, on top of the $In_yGa_{1-y}N$. Adjacent $In_yGa_{1-y}N$ features in the stacks can be merged by growth of the $In_zGa_{1-z}N$, leading to a relaxed (z=y) or partially relaxed (z≠y) $In_zGa_{1-z}N$ film with an a lattice constant corresponding to the patterned relaxed $In_yGa_{1-y}N$ features.

The InGaN layers, e.g., 1402, 1414, 1508, 1518 can be bulk layers. One or more of the InGaN layers can form multi quantum wells.

The stripes and/or features can have nanoscale or microscale width/cross-section, for example, up to 1000 nanometer or up to 1000 micrometer width/diameter/cross-section/size.

Block 2310 represents the end result, a device structure. For example, one or more of the $In_yGa_{1-y}N$ and $In_zGa_{1-z}N$ layers can comprise one or more electronic or optoelectronic device structures. For example, the $In_zGa_{1-z}N$ layer can be used as a base layer for growth of one or more optoelectronic or electronic device structures.

Device Fabrication Embodiments (In,Ga,Al)N Optoelectronic Devices Grown on Relaxed c-Plane (In,Ga,Al)N-on-GaN Base Layers In this device embodiment, a relaxed $In_{0.25}Ga_{0.75}N$:Si base layer is fabricated using the method(s) described above. Using these method(s), the lattice mismatch of the InGaN base layer to, for example, an $In_{0.3}Ga_{0.7}N$ layer or quantum well in a device would be less than 10%, corresponding to the mismatch in a device structure emitting in the violet to blue.

The fabrication process is then finished with the deposition of a p-type InGaN layer. The p-InGaN layers are of superior to p-GaN layers, due to the higher activation of Mg in the lower band gap material allowing for significantly higher p-type carrier concentrations [11].

For (In,Ga)N based solar cells, excellent performance was shown for devices with an active layer thickness of ~200 nm [12-13], however restricted to devices with low In content in the active region and operating at wavelength below 450 nm (because higher In compositions in the active region led to the formation of crystal defects and degradation of the device performance). In addition, for MQW based solar cells, a high band offset between well and barrier layers led to problems in the carrier transport, and degradation of the device performance [14].

However, using relaxed $In_{0.25}Ga_{0.75}N$:Si base layers, for example, will largely mitigate the above issues, due to the significant reduction in lattice mismatch. The reduction in lattice mismatch allows the fabrication of a defect free thick intrinsic $In_{0.3}Ga_{0.7}N$ active layer, or a MQW structure, comprising $In_{0.3}Ga_{0.7}N$ wells and $In_{0.25}Ga_{0.75}N$ barriers with a small band offset between well and barrier layers. The advantages of using InGaN instead of GaN as base layer for optoelectronic devices were discussed in detail in [8].

In addition, a reduced lattice mismatch can enhance the In incorporation into the films during epitaxy, allowing growth of films with high In composition at higher temperatures for higher film quality [6].

The reduced lattice mismatch between well and barrier material or active region and host material will lead to increased electron hole overlap and improve internal quantum efficiency. The reduced lattice mismatch between active region and host material allows the fabrication of light emitting devices with thicker active regions resulting in reduced efficiency droop in the devices. The term droop is used to describe the typically observed decrease in quantum efficiency with increasing operating current [15]. Increasing the width of the active regions has been shown to mitigate droop [16].

The possibility of growing (In,Ga,Al)N with wide wells and thick active regions also allows the integration of LEDs and solar cells and operation of a single device as a light emitting and light absorbing device (solar cell), dependent on the way the device is biased.

Figure 24:
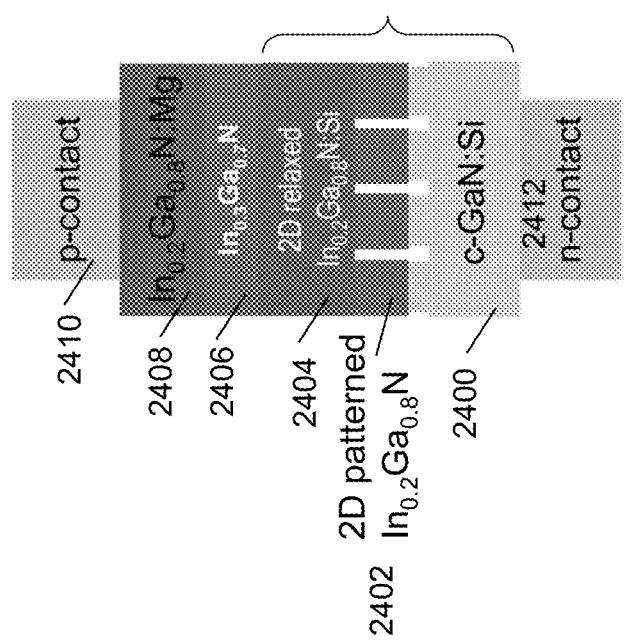
FIG. 24 is a cross-sectional schematic of a device fabricated according to one or more embodiments.

FIG. 24 illustrates an example of a device and an example of the above technique of fabricating devices. Any growth technique can be used to fabricate the device structures, such as Metal Organic Vapor Phase Epitaxy, Molecular Beam Epitaxy, or Hydride Vapor Phase Epitaxy, for example.

The device in FIG. 24 comprises a c-GaN substrate 2400 doped with Si, two dimensionally (2D) patterned $In_{0.2}Ga_{0.8}N$ 2402 on the GaN substrate 2400, 2D relaxed $In_{0.2}Ga_{0.8}N$ 2404 on the patterned $In_{0.2}Ga_{0.8}N$ 2402, an In $In_{0.3}Ga_{0.7}N$ active region 2406 on the 2D relaxed $In_{0.2}Ga_{0.8}N$ 2404, and a p-type $In_{0.2}Ga_{0.8}N$ layer 2408 doped with Mg on the $In_{0.3}Ga_{0.7}N$ active region 2406. The patterned and relaxed $In_{0.2}Ga_{0.8}N$ layers 2402, 2404 can be n-type. A p-contact 2410 can be made to the p-type $In_{0.2}Ga_{0.8}N$ 2408 and n-contacts 2412 can be made either to the n-type GaN substrate 2400 or to the n-type $In_{0.2}Ga_{0.8}N$ layers 2402, 2404.

The device in FIG. 24 can be an LED, with an active region 2406 comprising 10 nm thick $In_{0.3}Ga_{0.7}N$, or 3 periods of ($In_{0.4}Ga_{0.6}N$ quantum wells/$In_{0.2}Ga_{0.8}N$ barriers).

The device in FIG. 24 can be a solar cell with an active region 2406 comprising 200 nanometer thick $In_{0.3}Ga_{0.7}N$ or 100 periods of a multi quantum well comprising ($In_{0.2}Ga_{0.8}N$ quantum wells/$In_{0.3}Ga_{0.7}N$ barriers).

Laser Diodes or electronic devices such as transistors can also be fabricated on the (In,Ga,Al)N base layers. Semi-polar and Non-polar devices could also be fabricated on (In,Ga,Al)N base layers All single composition layers in the example structure can be replaced by superlattices of the same average composition.

Instead of growing InGaN directly on top of the patterned InGaN-on-GaN film, a coalescence layer can be inserted which grows coherently on top of the nanofeatures and comprises GaN or InGaN with a lower In composition. The InGaN base layer can be partially relaxed. Partial relaxation is beneficial as long as the a lattice constant is larger than that of GaN.

However, embodiments of the present invention are not limited to these examples.

Device Fabrication Process Steps

Figure 25:
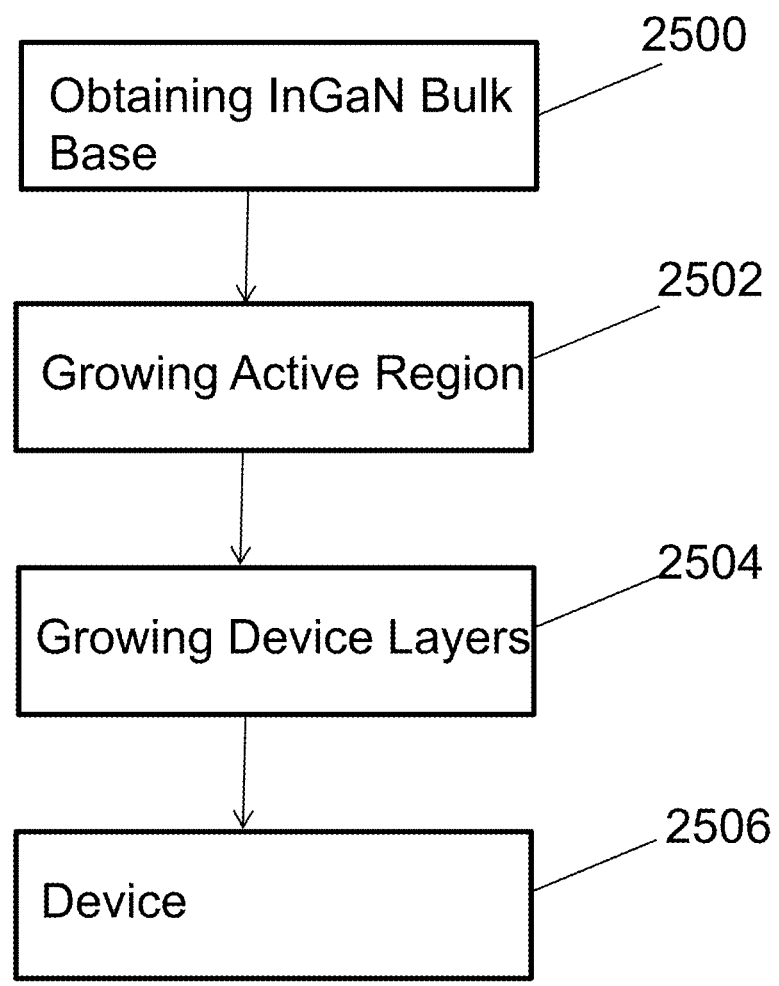
FIG. 25 is a flowchart illustrating a method of fabricating a device according to one or more embodiments.

FIG. 25 illustrates a method of fabricating a device, comprising the following steps.

Block 2500 represents obtaining an InGaN bulk base layer. The InGaN bulk base layer can be formed by patterning a coherently grown InGaN layer on a GaN substrate; and depositing relaxed InGaN on the patterned InGaN, wherein the InGaN bulk base layer comprises the relaxed InGaN.

The InGaN bulk base layer can be on a GaN template or substrate. The GaN substrate can be a c-plane GaN substrate.

The step can comprise performing one or more iterations of following steps (1)-(3) until an (In,Ga)N film is transformed into the InGaN bulk base layer (1) growing the (In,Ga)N film, within critical thickness limits for the (In,Ga)N film, on an underlayer; (2) etching or patterning the (In,Ga)N film into nano- or micro segments or stripes, resulting in at least partial relaxation of the (In,Ga)N film into at least partially relaxed segments or stripes of the (In,Ga)N film; (3) re-growing the (In,Ga)N film, wherein the nano-segments or stripes are merged or coalesced to form an at least partially relaxed (In,Ga)N layer, wherein (i) the underlayer in a first iteration of the steps (1)-(3) is a GaN substrate or template, and (ii) the underlayer in a next iteration of the steps is the re-grown (In,Ga)N layer from a previous iteration. The (In,Ga)N film can be an InGaN film or a nitride film comprising Gallium or Indium. A lattice constant and Indium (In) composition can be increased or decreased during subsequent iterations.

The (In,Ga)N film can comprise InGaN/GaN multi quantum wells (MQWs) that are patterned into pillar and stripe arrays in step (2). The re-grown (In,Ga)N in step (3) can comprise relaxed MQWs adopting an average lattice constant of the MQWs.

The patterned InGaN and relaxed InGaN can be two dimensionally or one dimensionally relaxed.

Block 2502 represents growing an InGaN active region coherently on or above the InGaN bulk base layer (on relaxed InGaN), wherein (i) a thickness and Indium composition of the InGaN active region are larger than a thickness and Indium composition of an InGaN active region that is not grown on the InGaN bulk base layer, and (ii) the InGaN bulk base layer is (a) at least partially relaxed, and (b) has one or more lattice constants that match one or more lattice constants of the InGaN active region grown on the InGaN bulk base layer.

The Indium composition of the active region can be at least 25%.

Block 2504 represents growing/forming further device layers/contacts, for example, a p-type InGaN layer on or above the InGaN active region. The GaN substrate can be a c-plane GaN substrate, and the InGaN bulk base layer can be at least in part n-type. However, a bottom of the InGaN bulk base layer could be any type of conductivity as long as contacts can be made to the n-type layers of the device. One or more device layers (e.g., one or more n-type layers) can also be formed between the active region and the base layer.

Block 2506 represents the end result, a device structure or device, such as an optoelectronic device including a light emitting diode, laser diode, or solar cell.

In one embodiment, the device comprises an optoelectronic or electronic device, comprising an at least partially relaxed, defect free InGaN bulk base layer, having a planar surface and an Indium composition of at least 25%; and a device structure, including an InGaN active region having an Indium composition of at least 25%, grown on the InGaN bulk base layer.

One or more embodiments of the present invention can achieve the InGaN pseudo substrate having a surface roughness of 0.25 nm or less (or at most 0.25 nanometers (nm)) over an area of at least 1 μm×1 μm and/or a V-defect density of $5 \times 10^8$ cm$^{-2}$ or less (or at most $5 \times 10^8$ cm$^{-2}$).

In one embodiment, the optoelectronic device comprises (a) an (e.g., n-type) InGaN bulk base layer deposited on a GaN substrate; (b) an InGaN active region coherently on or above the InGaN bulk base layer, wherein: (i) a thickness and Indium composition of the active region (e.g., at least 25%) are larger than a thickness and Indium composition of an InGaN active region that is not grown on the InGaN bulk base layer; and (ii) the InGaN bulk base layer is (a) at least partially relaxed, and (b) has one or more lattice constants that match one or more lattice constants of the InGaN active region grown on the InGaN bulk base layer; and (c) one or more device layers (e.g., p-type InGaN layer) deposited on or above the InGaN active region. The device can further comprise n-type and/or p-type contacts to doped layers.

Metamorphic Growth

While in cubic semiconductors lattice mismatch can be relieved through defect formation in passive regions of the device structure, the absence of a low energy glide plane in c-plane hexagonal crystals may prevent the utilization of this concept for c-plane (In,Ga,Al)N. However, Daeubler et. al., [17] showed that the concept can work when the InGaN films are grown by MBE and one or more of the inventors have repeated these experiments successfully. The metal layer present during growth of MBE films prevents the formation of the typical V-defects in MOCVD, obviously activating the second order m-glide plane. In one or more embodiments of the present invention, a planar metamorphic InGaN layer (e.g., 1.5 micrometers thick, $\Delta a/a = 7920$ ppm, a=0.221, a lattice constant, corresponding to $In_{0.07}Ga_{0.93}N$) can be grown by MBE and an optoelectronic or electronic device (e.g., LED) structure can be grown on top of the InGaN by MOCVD [17].

Example 33

Figure 26:
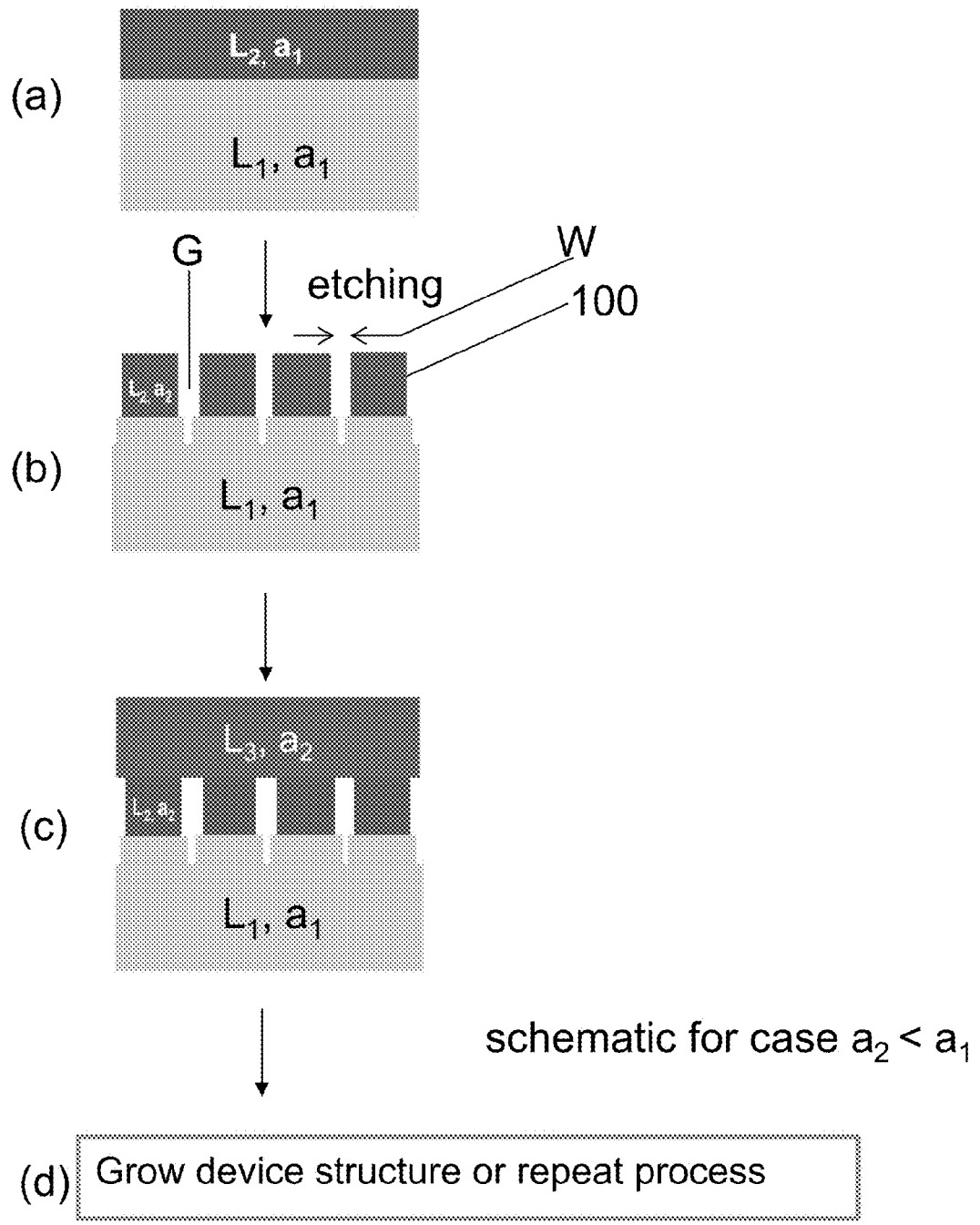
Figure 27:
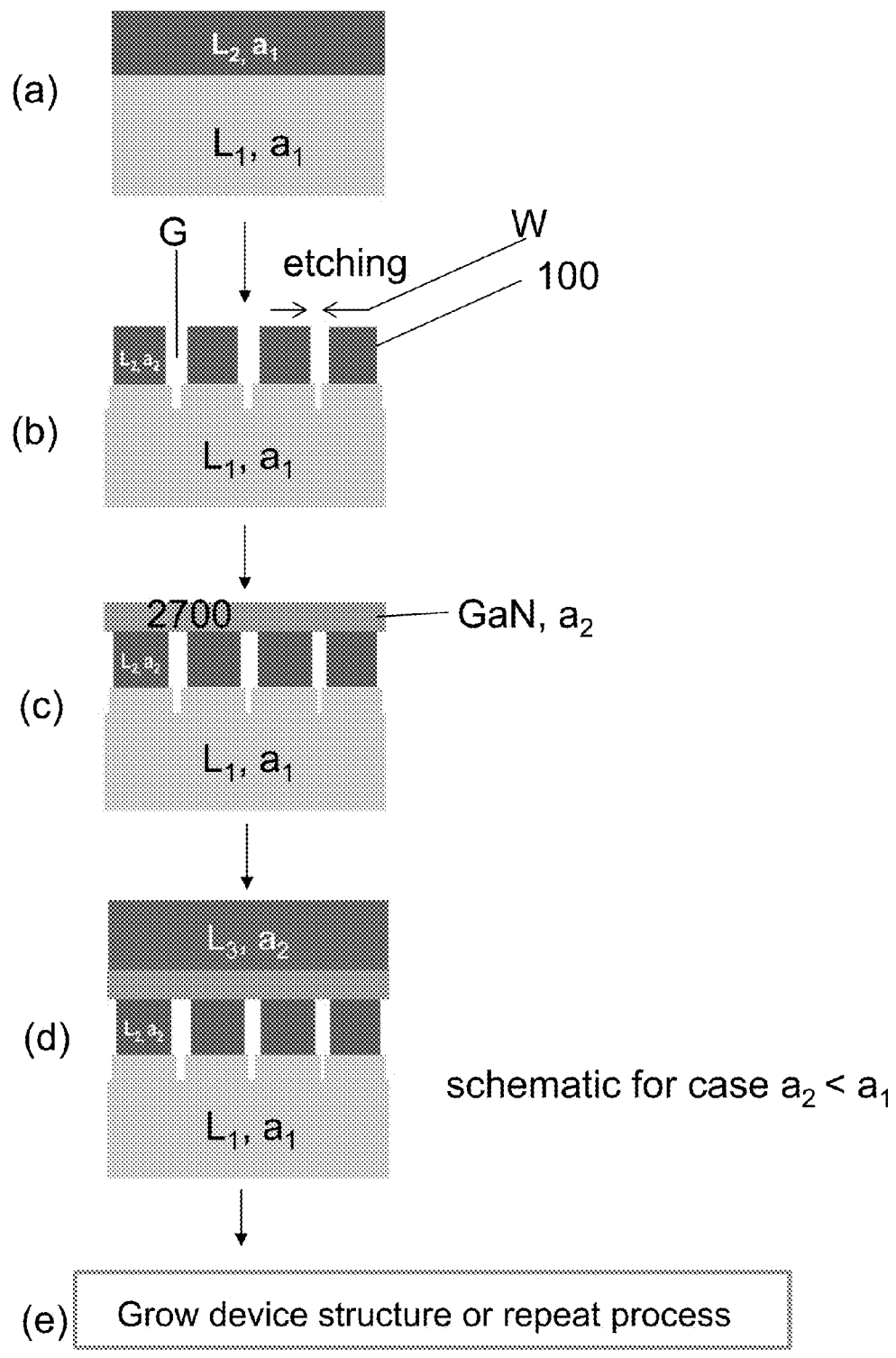
FIG. 27 shows cross-sectional schematics of layer structures, illustrating a modified process with coalescence layer for the case $a_2<a_1$, comprising (a) depositing layer $L_2$ coherently strained on layer $L_1$, (b) etching $L_2$ into nanofeatures, wherein $L_2$ relaxes after etching into nanofeatures, (c) growing a coalescence layer having lattice constant $a_c=a_2$ and that is coherently strained on top of the nanofeatures, (d) continuing deposition of $L_2$ on relaxed nanosegments, and (e) growing the device structure onto relaxed layer $L_2$ serving as the new base layer, or repeating the process (similar to FIG. 2).

Examples 1 to 32 describe the application of the method for devices with an active layer with a lattice constant larger than GaN. The same approach(es) can be used for the fabrication of devices with active layers with a lattice constant smaller than GaN for devices operating in the Ultra Violet (UV). Thereby, as illustrated in FIG. 26, the lattice constant is stepped to lower values when starting from GaN, by growing a strained $Al_xGa_{1-x}N$ layer $L_2$ on top of the GaN base layer $L_1$ (FIG. 26(a)), patterning the strained $Al_xGa_{1-x}N$ layer $L_2$ such that the $Al_xGa_{1-x}N$ layer $L_2$ adopts its relaxed lattice constant with $a_2(AlGaN) < a_1(GaN)$, where $a_2$ is the lattice constant of AlGaN and $a_1$ is the lattice constant of GaN (FIG. 26(b)), and coalescing the nanofeatures with $Al_yGa_{1-y}N$ under formation of a relaxed or partially relaxed $Al_yGa_{1-y}N$ layer $L_3$ (FIG. 26(c)). As described for InGaN applications, the patterned relaxed nanofeatures 100 can also be coalesced with a thin GaN layer 2700, as illustrated in FIG. 27(c), which is coherently strained to the $Al_xGa_{1-x}N$ nanofeatures 100, followed by a thick $Al_yGa_{1-y}N$ layer $L_3$ which is relaxed or partially relaxed, as shown in FIG. 27(d). In another example the growth can be initiated on AlN, and the lattice constant increased towards AlGaN, similar to the process for InGaN on GaN.

The process can also include a repeated cycle (FIG. 26(d)) following a similar procedure to that illustrated in FIG. 2.

Further Possible Modifications and Variations

As described above, the method applies to any system of solids with a common crystal structure, where individual components distinguish in their specific lattice constants.

The method can be applied to any orientation of the crystal under consideration, for example c-, m-, a-, and all semipolar GaN orientations.

The merging of the nanosegments can be executed by a different method than the layer growth process, for example, annealing in a specific ambient or using atomic layer deposition (ALD).

The film deposition can be performed by any crystal growth method, for example metal organic chemical vapor deposition (MOCVD), molecular beam epitaxy (MBE), hydride vapor phase epitaxy (HVPE), pulse laser deposition (PLD), or sputtering.

Several growth and merging techniques can be used in the fabrication process.

Merging of the segments (e.g., nanosegments) can be performed either by overgrowing the gaps between the individual segments leaving behind voids, or closing the gaps between the nanosegments in the merging or growth process.

The etching process into segments (e.g., nanosegments) can be conducted by any technique, for example, ion beam, holography, nanosphere or imprint patterning, and consecutive reactive ion beam etching or focused ion beam etching. If desired, wet etching, including electrochemical etching, or any combination of etching techniques, can also be used.

The nanopatterns are preferentially fabricated using holography (e.g., holographic lithography) or nanoimprinting, wider patterns using UV-stepper or standard stepper technology, all allowing large area pattern fabrication. For example, a deep UV stepper (e.g., ASML DUV Stepper) could be used. A UV stepper can fabricate features down to about 400 nm in size, for example.

For example, a "stencil" can be made by holography and then imprinted.

Embodiments include growth and processing of InGaN/GaN heterostructures for the fabrication of relaxed (In,Ga,Al)N base layers, followed by growth and fabrication of (In,Ga,Al)N LEDs or solar cells (operating in the 500-600 nm range of the electromagnetic spectrum) on the (In,Ga,Al)N base layers. InGaN/GaN heterostructures can be grown and processed according to the procedures described above.

Advantages and Improvements

One or more embodiments of the present invention can fabricate relaxed InGaN films. For example, one dimensional relaxation of a bulk InGaN layer can be achieved.

One or more method embodiments of the present invention allow the fabrication of c-plane (0001) (In,Ga,Al)N optoelectronic devices which were previously impossible to fabricate without introducing crystal defects. The (Al,Ga,In)N alloy system is a direct band gap system with a band gap ranging from 6.1 eV for AlN, to 0.7 eV for InN. The lattice mismatch between AlN and InN is, however, as large as 13%, with 10% mismatch between GaN and InN.

Expanding the operation range of (Al,Ga,In)N devices into the green, yellow and red range of the electromagnetic spectrum is therefore complicated by an extremely large lattice mismatch when GaN is considered as the substrate. To date, however, only bulk GaN substrates are available, and only a few attempts have been undertaken to fabricate thick InGaN layers on GaN as alloy substrates because of difficulties in the growth of InGaN using the typical substrate growth method, Hydride Vapor Phase Epitaxy (HVPE).

Using one or more embodiments of the present invention, layer structures with large differences in lattice constants can be fabricated. The application to fabrication of pseudosubstrates, for example $In_xGa_{1-x}N$ pseudosubstrates, promises to overcome the limitations of the so called "green gap" and fabrication of high efficiency InGaN LEDs and solar cells with In-compositions exceeding 30%.

One or more embodiments of the present invention can improve performance of existing devices which require combination of layers with large lattice mismatch, for example green LEDs and laser diodes, through mitigation of defect formation in the active layer. For example, the fabrication of a relaxed base layer serving a pseudo substrate with a lattice constant close to that of the active region mitigates defect formation in active layer and allows the increase of the thickness of the active layers of the devices and, in c-plane devices significantly reduced polarization fields in the device structure.

In addition, certain applications, for example multi junction solar cells, require vertical stacking of relatively thin layers with large differences in their lattice constant (because the critical thickness of a mismatched layer, representing the maximum thickness for the deposition of a defect free layer, is inversely proportional to the lattice mismatch [1]). For $In_{0.3}Ga_{0.7}N$ on GaN, for example, the critical thickness was estimated to be below 3 nm.

One or more embodiments of the present invention enable the possibility of increasing the thickness of the active layers of the devices and leads, in c-plane devices, to significantly reduced polarization fields in the device structure.

For example, when grown in the typical c-direction, the large lattice mismatch between GaN and InGaN layers is accompanied by the existence of large polarization fields in the crystal, which result in electron hole separation in InGaN/GaN quantum wells, reducing the recombination probability of excitons. Since, in typical Ga-polar InGaN/GaN heterojunction light emitting devices, the internal polarization field is directed in the opposite direction than the externally applied electric field, further problems arise, in particular for solar cell applications. Both effects also contribute to the efficiency degradation LEDs when operated at higher currents, called "droop".

Experiments have shown that the "droop" can be mitigated thorough the growth of devices with thick Quantum Wells (QWs) or active regions. However, presently this approach can only be applied for devices with a low In composition in the QW, emitting in the Ultra Violet (UV) to blue, as the above mentioned restrictions related to the critical thickness of InGaN on GaN, and the increase in the internal electric field, presently prevent the implementation for devices emitting at longer wavelength.

The growth on (In,Ga)N-on-GaN base layers, where the InGaN layer is relaxed, significantly widens the design window for devices, as the lattice mismatch between current carrying and active device layers can be kept low, preventing defect formation in the active, high composition In layers, and minimizing the internal electric fields in the heterostructures.

Due to the higher Indium incorporation efficiency into relaxed or partially relaxed InGaN films, the growth temperature can be increased resulting in improved film quality.

One or more embodiments of the present invention enable demonstration of devices utilizing previously un-accessible layer combination because of large lattice mismatch restrictions.

Electronic devices such as transistors could be fabricated using one or more method embodiments of the present invention.

Non-polar/Semi-polar III-nitride optoelectronic and electronic devices, such as LEDs, LDs, solar cells, and transistors, can also be fabricated.

REFERENCES

The following references are incorporated by reference herein.

[1] J. W. Matthews and A. E. Blakeslee: J. Cryst. Growth 27 (1974) 118.

[2] M. S. Gudiksen, L. J. Lauhon, J. Wang, D. C. Smith, C. M. Lieber, Nature 415 (2002) 617.

[3] M. T. Björk et al., Appl. Phys. Lett. 81, 4458 (2002).

[4] S. Keller, C. Schaake, N. A. Fichtenbaum, C. J. Neufeld, Y. Wu, K. McGroddy, A. David, S. P. DenBaars, C. Weisbuch, J. S. Speck, and U. K. Mishra, "Optical and Structural Properties of GaN Nanopillar and Nanostripe Arrays With Embedded InGaN/GaN multi-quantum wells", Journal of Applied Physics 100, 054314 (2006), J. Appl. Phys. 100, 054314 (2006).

[5] S. Keller, N. A. Fichtenbaum, C. Schaake, C. J. Neufeld, A. David, E. Matioli, Y. Wu, S. P. Denbaars, J. S. Speck, C. Weisbuch, and U. K. Mishra, "Optical Properties of GaN Nanopillar and Nanostripe Arrays With Embedded InGaN/GaN Multi-Quantum Wells", phys. stat. sol. (b) 244, 1797 (2007).

[6] T. Yayama, Y. Kanagawa, K. Kakimoto, and A. Koukitu, Phys. Stat. Sol. (C), 7, 2249 (2010).

[7] T. Böttcher, S. Einfeldt, S. Figge, R. Chierchia, H. Heinke, and D. Hommel, Appl. Phys. Lett. 78, 1976 (2001).

[8] T. K. Sharma and E. Towe, J. Appl. Phys. 107, 024516 (2010).

[9] S. Luryi and E. Suhir, "New approach to the high quality epitaxial growth of lattice-mismatched materials," Appl. Phys. Lett. 49(3) (1986).

[10] D. Zubia and S. D. Hersee, "Nanoheteroepitaxy: The Application of nanostructuring and substrate compliance to the heteroepitaxy of mismatched semiconductor materials," Journal of Applied Physics, Vol. 85, No. 9 (1999).

[11] K. Kumakura, T. Makimoto, and N. Kabayashi, J. Appl. Phys. 93, 3370 (2003).

[12] C. J. Neufeld, N. G. Toledo, S. C. Cruz, M. Iza, S. P. DenBaars, and U. K. Mishra, Appl. Phys. Lett. 93 (2008) 143502.

[13] R. M. Farrell, C. J. Neufeld, S. C. Cruz, J. R. Lang, M. Iza, S. Keller, S, Nakamura, S. P. DenBaars, U. K. Mishra, and J. S. Speck, Appl. Phys. Lett. 98 (2011) 201107.

[14] Jordan R. Lang, Dissertation, UCSB 2012.

[15] A. David and M. J. Grundmann, Appl. Phys. Lett. 96 103504 (2010).

[16] Y. C. Shen, G. O. Mueller, S. Watanabe, N. F. Gardner, A. Munkholm, and M. R. Krames, Appl. Phys. Lett. 91, 141101 (2007).

[17] Presentation by Daeubler et. al., Growth and Characterization of Metamorphic GaInN-on-GaN Buffer Layers with Enlarged In-Plane Lattice Parameter as Template for Strain-Engineered Long Wavelength GaInN QW Emitters, Aug. 27, 2013, International Conference on Nitride Semiconductors ICNS10.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a heterostructure device, comprising:
    (a) obtaining a first layer or substrate;
    (b) forming a second layer that is at least partially relaxed, comprising:
        growing the second layer on the first layer or substrate as a coherently strained second layer, within critical thickness limits for the second layer and etching the coherently strained second layer into segments having up to a 1000 micrometer width, or
        growing a plurality of relaxed III-nitride pillars on the first layer or substrate comprising a Gallium Nitride (GaN) layer, wherein:
            the relaxed III-nitride pillars include Indium or Gallium, or Indium and Gallium, and
            the relaxed III-nitride pillars are selectively seeded on the GaN layer and have a width up to 1000 micrometers;
    wherein:
        (1) the first layer and the second layer have the same lattice structure but different lattice constants,
        (2) the first layer and the second layer form a heterojunction, and
        (3) the heterojunction forms an active area of a device or serves as a pseudo-substrate for the device; and
    (c) continuing growth of, or re-growing the second layer, wherein the segments are merged or coalesced.

2. The method of claim 1, wherein the first layer is GaN and the second layer is a nitride containing Indium, Gallium, or Indium and Gallium.

3. The method of claim 1, further comprising:
    repeating the steps (a)-(c) using the re-grown or coalesced second layer as the first layer in (a), wherein the segments comprise stripes;
    changing an orientation of the stripes of the layers in the subsequently deposited heterojunctions to obtain the 2-dimensional relaxation; and
    gradually increasing or decreasing the lattice constants of the layers in the subsequently deposited heterojunctions.

4. The method of claim 1, further comprising coalescing the segments with a coherently strained coalescence layer, wherein the coalescing is initiated by raising a temperature above a temperature used to grow the coherently strained coalescence layer prior to continuing the growth of the second layer.

5. The method of claim 1, further comprising:
    depositing mask material at a bottom or at a bottom and on a top of the segments to promote coalescence of the segments, and
    after the segments are merged,
        continuing growth of the second layer to overgrow masked areas masked by the mask material, thereby forming a continuous at least partially relaxed second layer, or
        interrupting the growth, removing the mask material on the top of the segments, and continuing the growth of the second layer afterwards.

6. The method of claim 1, wherein:
    the etching further comprises:
        etching the coherently strained second layer into a pattern of stripes resulting in at least partial relaxation of the coherently strained second layer into at least partially relaxed stripes having up to a 1000 micrometer width; and
    the re-growing of the second layer comprises:
        (i) growing a GaN coalescence layer under one dimensional (1D) tensile strain on top of the stripe pattern, adopting an a-lattice constant of the stripes in the stripe pattern, and
        (ii) growing an InGaN layer on the GaN coalescence layer, wherein the InGaN layer adopts the a-lattice constant of the stripes and results in 1D relaxation of the InGaN layer.

7. The method of claim 6, further comprising patterning the InGaN layer into stripes with an angle between 30 and 90 degrees with respect to the stripes in the second layer, resulting in full or partial two dimensional relaxation of the InGaN layer.

8. The method of claim 1, further comprising:
    growing the second layer as a coherently strained InGaN second layer, within critical thickness limits for the second layer, on the first layer comprising GaN; and
    forming the second layer, comprising:
        etching the coherently strained second layer into a pattern of first stripes resulting in at least partial relaxation of the coherently strained second layer into at least partially relaxed stripes having up to a 1000 micrometer width; and
    growing a first coalescence layer having a thickness of 20 nm or less and a different composition to the second layer, on top of the pattern of the first stripes;
    patterning the first coalescence layer and the second layer into a pattern of second stripes with an angle between 30 and 90 degrees with respect to the first stripes in the second layer, resulting in formation of posts in the second layer and full or partial two dimensional relaxation of the second layer;
    coalescing the second stripes with a second coalescence layer having a thickness of 20 nm or less; and
    growing an InGaN layer on the second coalescence layer, wherein the InGaN layer adopts the lattice constant of the posts and has a different material composition to the second coalescence layer.

9. The method of claim 1, further comprising:
    growing the second layer as a coherently strained second layer, within critical thickness limits for the second layer, and
    forming the second layer, comprising:
        etching the coherently strained second layer into a pattern of the segments resulting in at least 1-dimensional or 2-dimensional partial relaxation of the coherently strained second layer into at least partially relaxed segments having up to a 1000 micrometer width; and the continuing growth of, or the re-growing of, the second layer, wherein the segments are merged or coalesced.

10. The method of claim 1, further comprising:
growing the second layer comprising a coherently strained second layer, within critical thickness limits for the second layer, and forming the second layer, comprising:
etching the coherently strained second layer into the segments resulting in at least partial relaxation of the coherently strained second layer into at least partially relaxed segments having up to a 1000 micrometer width; and merging the segments by growing a coalescence layer composed of a material with a different composition than the coherently strained second layer.

11. The method of claim 1, wherein:
the first layer comprises a Gallium Nitride layer,
the growing and the forming of the second layer comprises:
depositing a mask material on the Gallium Nitride layer, wherein the mask material includes openings having a width up to 1000 micrometers; and growing and forming the second layer comprising the relaxed III-nitride pillar in each of a plurality of the openings, to form a plurality of the III-nitride pillars, wherein the relaxed III-nitride pillars include Indium or Gallium, or Indium and Gallium; and the continuing growth of the III-nitride pillars includes the III-nitride pillars overgrowing the openings to form the relaxed III-nitride film including Indium and/or Gallium.

12. The method of claim 1, further comprising:
growing the second layer comprising an InGaN bulk base layer;
growing an InGaN active region coherently on or above the InGaN bulk base layer, wherein:
(i) a thickness and Indium composition of the InGaN active region are larger than a thickness and Indium composition of an InGaN active region that is not grown on the InGaN bulk base layer, and
(ii) the InGaN bulk base layer:
(a) is at least partially relaxed, and
(b) has one or more lattice constants that match one or more lattice constants of the InGaN active region grown on the InGaN bulk base layer.

13. The method of claim 1, further comprising:
growing the second layer comprising an n-type InGaN bulk base layer deposited on the first layer comprising a GaN substrate; and
growing an InGaN active region coherently on or above the InGaN bulk base layer, wherein:
(i) a thickness and Indium composition of the active region are larger than a thickness and Indium composition of an InGaN active region that is not grown on the InGaN bulk base layer, and
(ii) the InGaN bulk base layer:
(a) is at least partially relaxed, and
(b) has one or more lattice constants that match one or more lattice constants of the InGaN active region grown on the InGaN bulk base layer, and
(c) a p-type InGaN layer deposited on or above the InGaN active region.

14. The method of claim 13, further comprising:
patterning the InGaN on the GaN substrate; and
relaxed InGaN on the patterned InGaN, wherein the InGaN bulk base layer comprises the relaxed InGaN and the active region is deposited on the relaxed InGaN.

15. The method of claim 1, wherein the second layer comprises one or more quantum wells.

16. The method of claim 1, wherein the first layer is GaN and the second layer is a nitride containing Aluminum, Gallium, or Aluminum and Gallium.

17. The method of claim 16, further comprising repeating the steps (a)-(c) using the re-grown or coalesced second layer as the first layer in (a) and gradually decreasing or stepping down the lattice constants of the layers in the subsequently deposited heterojunctions.

18. A method of fabricating a heterostructure, comprising:
(a) obtaining a first layer or substrate comprising a III-nitride or GaN base layer;
(b) growing a second layer, comprising:
(i) (1) depositing a strained $In_xGa_{1-x}N$ layer on top of the III-nitride or GaN base layer or (2) depositing a strained $In_xGa_{1-x}N$ layer in nano or micron sized or width openings formed on a surface of the GaN or III-nitride base layer; and
(ii) depositing an $In_yGa_{1-y}N$ layer on the $In_xGa_{1-x}N$ layer to form a two layer stack, wherein the $In_yGa_{1-y}N$ layer is thicker than the $In_xGa_{1-x}N$ layer and y<x,
(iii) optionally further comprising, when the strained $In_xGa_{1-x}N$ layer is deposited using (1), (3) etching the two layer stack with a pattern to form etched features; and
(c) selectively etching the thinner $In_xGa_{1-x}N$ layer, undercutting the thicker $In_yGa_{1-y}N$ layer in such a way that only a post remains, wherein the thicker $In_yGa_{1-y}N$ layer is detached from the base layer so that it can relax and adopt its unstrained lattice constant; and
(d) growing an $In_xGa_{1-x}N$ layer on top of the $In_yGa_{1-y}N$ layer;
wherein
(1) the first layer and the second layer have the same lattice structure but different lattice constants,
(2) the first layer and the second layer form a heterojunction, and
(3) the heterojunction forms an active area of a device or serves as a pseudo-substrate for the device.

19. The method of claim 18, wherein the pattern comprises first stripes oriented in a first direction, the method further comprising repeating steps (a)-(d) wherein:
the $In_xGa_{1-x}N$ layer is the base layer for the next step (a);
the strained $In_xGa_{1-x}N$ layer in the next step (b) is an $In_sGa_{1-s}N$ layer,
the thicker $In_yGa_{1-y}N$ layer in the next step (b) is a $In_tGa_{1-t}N$ layer with s>t such that the $In_sGa_{1-s}N$ layer and the $In_tGa_{1-t}N$ layer form a coherently strained stack;
the etching in the next step (3) is with the pattern comprising second stripes oriented in a second direction;
the $In_zGa_{1-z}N$ layer in the next growing step (d) is fully relaxed for y=t=z or partially relaxed in the presence of small differences between y, t, and z; and
x, y, z, t are compositions of Indium in the InGaN layers.

20. The method of claim 18, wherein adjacent $In_yGa_{1-y}N$ features in the stacks are merged by growth of the $In_zGa_{1-z}N$, leading to a relaxed (z=y) or partially relaxed (z≠y) $In_zGa_{1-z}N$ film with a lattice constant corresponding to the patterned relaxed $In_yGa_{1-y}N$ features.

21. The method of claim 18, further comprising depositing the strained $In_xGa_{1-x}N$ layer only in the nano or micron sized or width openings and/or selectively etching the thinner $In_xGa_{1-x}N$ layer only.

22. An optoelectronic or electronic device, comprising:
a second layer comprising an InGaN bulk base layer grown from a first layer or substrate, wherein:
  (1) the first layer and the second layer have the same lattice structure but different lattice constants,
  (2) the first layer and the second layer form a heterojunction,
  (3) the heterojunction forms an active area of a device or serves as a pseudo-substrate for the device; and
an InGaN active region coherently on or above the InGaN bulk base layer, wherein:
  (i) a thickness and Indium composition of the InGaN active region are larger than a thickness and Indium composition of an InGaN active region that is not grown on the InGaN bulk base layer, and
  (ii) the InGaN bulk base layer:
    (a) is at least partially relaxed, and
    (b) has one or more lattice constants that match one or more lattice constants of the InGaN active region grown on the InGaN bulk base layer.

23. The optoelectronic or electronic device of claim 22, further comprising a device structure grown on the InGaN bulk base layer, wherein:
the device structure includes the InGaN active region having the Indium composition of at least 25%, and
the InGaN bulk base layer is defect free, has a planar surface, and an Indium composition of at least 25%.

* * * * *